(12) United States Patent
Shin et al.

(10) Patent No.: US 12,384,129 B2
(45) Date of Patent: Aug. 12, 2025

(54) GUIDE FILM AND METHOD OF MANUFACTURING DISPLAY APPARATUS

(71) Applicant: SAMSUNG DISPLAY CO., LTD., Yongin-si (KR)

(72) Inventors: Hosik Shin, Yongin-si (KR); Hyejin Joo, Yongin-si (KR); Jaemin Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 59 days.

(21) Appl. No.: 17/355,554

(22) Filed: Jun. 23, 2021

(65) Prior Publication Data

US 2022/0118731 A1 Apr. 21, 2022

(30) Foreign Application Priority Data

Oct. 15, 2020 (KR) .......................... 10-2020-0133739

(51) Int. Cl.
  *B32B 3/04* (2006.01)
  *B32B 3/02* (2006.01)
  *B32B 37/12* (2006.01)

(52) U.S. Cl.
  CPC .................. *B32B 3/04* (2013.01); *B32B 3/02* (2013.01); *B32B 37/1284* (2013.01); *B32B 2307/40* (2013.01); *B32B 2457/20* (2013.01)

(58) Field of Classification Search
  CPC ... B32B 3/02; B32B 2307/40; B32B 2457/20; B32B 3/04; B32B 37/0007; B32B 37/025; B32B 37/1284; B32B 38/1866; H01L 51/56; H01L 2251/56; G09F 9/301
  See application file for complete search history.

(56) References Cited

U.S. PATENT DOCUMENTS

| | | | | |
|---|---|---|---|---|
| 4,352,217 A | * | 10/1982 | O'Rourke | ............ A47C 27/085 5/915 |
| 4,870,766 A | * | 10/1989 | Topping | ............... A47G 1/0633 40/788 |
| 8,585,454 B2 | | 11/2013 | Cha et al. | |
| 9,139,332 B1 | * | 9/2015 | Roberts | .............. B65D 19/0002 |
| 11,316,139 B2 | | 4/2022 | Kuon et al. | |

(Continued)

FOREIGN PATENT DOCUMENTS

| | | | |
|---|---|---|---|
| CN | 108766977 A | 11/2018 | |
| CN | 111627338 A * | 9/2020 | ............. G09F 9/301 |

(Continued)

OTHER PUBLICATIONS

AZO Materials, Silicone rubber https://www.azom.com/properties.aspx?ArticleID=920 accessed Feb. 6, 2024.*

*Primary Examiner* — Alicia J Weydemeyer
(74) *Attorney, Agent, or Firm* — CANTOR COLBURN LLP

(57) ABSTRACT

A guide film includes a main area, a first subsidiary area, and a second subsidiary area being apart from the first subsidiary area. The main area includes a central area having a rectangular shape in a plan view, a first side area arranged between the central area and the first subsidiary area, a second side area arranged between the central area and the second subsidiary area, and a first corner area connecting the first side area to the second side area.

8 Claims, 31 Drawing Sheets

(56) References Cited

U.S. PATENT DOCUMENTS

| | | | |
|---|---|---|---|
| 2010/0122563 A1* | 5/2010 | Durney | B21D 37/10 |
| | | | 72/472 |
| 2011/0241063 A1* | 10/2011 | Winscom | B32B 17/10009 |
| | | | 257/E33.013 |
| 2014/0363592 A1* | 12/2014 | Zhou | A47G 1/0633 |
| | | | 428/32.22 |
| 2016/0021764 A1 | 1/2016 | Lee et al. | |
| 2019/0329540 A1 | 10/2019 | Kim et al. | |
| 2020/0160761 A1 | 5/2020 | Ahn et al. | |
| 2020/0176696 A1* | 6/2020 | Dai | H10K 59/173 |
| 2021/0379881 A1 | 12/2021 | Lee et al. | |

FOREIGN PATENT DOCUMENTS

| | | | |
|---|---|---|---|
| EP | 0522252 A1 * | 4/1992 | |
| EP | 3923341 A1 | 12/2021 | |
| KR | 1020070072296 A | 7/2007 | |
| KR | 1020110099486 A | 9/2011 | |
| KR | 101932258 B1 | 12/2018 | |
| KR | 1020190124358 A | 11/2019 | |
| KR | 1020200078243 A | 7/2020 | |
| WO | 2019231191 A1 | 12/2019 | |

\* cited by examiner

GUIDE FILM AND METHOD OF MANUFACTURING DISPLAY APPARATUS

This application claims priority to Korean Patent Application No. 10-2020-0133739, filed on Oct. 15, 2020, and all the benefits accruing therefrom under 35 U.S.C. § 119, the content of which in its entirety is herein incorporated by reference.

BACKGROUND

1. Field

Embodiments relate to a guide film and a method of manufacturing a display apparatus.

2. Description of Related Art

Mobile electronic apparatuses are widely in use. As mobile electronic apparatuses, not only miniaturized electronic apparatuses such as mobile phones but also tablet personal computers ("PCs") are being widely used recently.

To support various functions, the mobile electronic apparatuses include a display device to provide a user with visual information such as an image. Recently, because parts driving a display device have been miniaturized, a proportion of a display device in an electronic apparatus has gradually increased and also a structure that includes two or more display areas foldable at a preset angle is under development.

SUMMARY

Embodiments include a guide film for stably changing a shape of a display panel and a method of manufacturing a display apparatus including a corner display area arranged around a corner of a main display area of the display panel. However, such a technical problem is an example, and the invention is not limited thereto.

Additional features will be set forth in part in the description which follows and, in part, will be apparent from the description, or may be learned by practice of the presented embodiments of the invention.

In an embodiment of the invention, a guide film includes a main area including a central area having a rectangular shape in a plan view, a first side area, a second side area and a first corner area connecting the first side area to the second side area, a first auxiliary area connected to a first edge of the main area, and a second subsidiary area connected to a second edge of the main area that intersects the first edge of the main area, the second auxiliary area being apart from the first subsidiary area. The first side area is disposed between the central area and the first auxiliary area, a second side area is disposed between the central area and the second auxiliary area.

In an embodiment, the guide film may further include a third auxiliary area connected to a third edge and apart from the second auxiliary area, the third edge being parallel to the first edge of the main area. The main area may further include a third side area between the central area and the third auxiliary area, and a second corner area connecting the second side area to the third side area.

In an embodiment, the guide film may further include a fourth auxiliary area connected to a fourth edge and apart from the third auxiliary area, the fourth edge being parallel to the second edge of the main area. The main area may further include a fourth side area between the central area and the fourth auxiliary area, and a third corner area connecting the third side area to the fourth side area.

In an embodiment, the main area, the first auxiliary area, the second auxiliary area, the third auxiliary area, and the fourth auxiliary area may be provided as one area.

In an embodiment, a modulus of the first corner area may be about 1 megapascal (MPa) to about 50 MPa.

In an embodiment, the first corner area may include silicon rubber.

In an embodiment, an edge of the first corner area may be convex.

In an embodiment, the first corner area may have a cut portion.

In an embodiment, the cut portion may have a closed-curve shape.

In an embodiment, the main area may have a multi-layered structure, and the first auxiliary area and the second auxiliary area each may have a same layered structure as a layered structure of the main area.

In an embodiment, the main area may include a first layer, a second layer, and a third layer arranged between the first layer and the second layer.

In an embodiment, a modulus of the first layer and the second layer may be less than a modulus of the third layer.

In an embodiment of the invention, a method of manufacturing a display apparatus includes preparing a cover window and a display panel, attaching the guide film to a first side of the display panel, changing a shape of the display panel by applying an external force to the guide film, and aligning a second side of the display panel opposite to the first side toward the cover window to attach the cover window to the display panel.

In an embodiment, the attaching the guide film to the first side of the display panel may include attaching the main area of the guide film to the first side of the display panel.

In an embodiment, the display panel may include a main display area, a first subsidiary display area, a second subsidiary display area, and a corner display area, the first subsidiary display area being connected to a first side of the main display area, the second subsidiary display area being connected to a second side intersecting the first side of the main display area, and the corner display area being arranged between the first subsidiary display area and the second subsidiary display area, and the transforming the shape of the display panel may include bending the first subsidiary display area, the second subsidiary display area, and the corner display area with respect to the main display area of the display panel.

In an embodiment, the first subsidiary display area, the second subsidiary display area, and the corner display area may be arranged on a same side with respect to the main display area.

In an embodiment, the first subsidiary display area, the second subsidiary display area, and the corner display area may be bent through a push member that applies an external force in a predetermined direction with respect to the main display area.

In an embodiment, the attaching the guide film to the first side of the display panel may include forming an adhesive layer on the first side of the display panel, the adhesive layer defining an opening that exposes a portion of the first side of the display panel, and attaching the guide film to the first side of the display panel by the adhesive layer.

In an embodiment, the method may further include bending a portion of the display panel that corresponds to the opening.

In an embodiment, the preparing the cover window may include transforming the cover window to have a curvature by a jig including a bent portion.

In an embodiment, the method may further include separating the guide film from the display panel.

In an embodiment, the method may further include hardening the cover window and the display panel attached to each other.

In an embodiment of the invention, a method of manufacturing a display apparatus includes preparing a cover window and a display panel, attaching a support film to a first side of the display panel, attaching a guide film to a side of the support film, the guide film having a modulus greater than a modulus of the support film, changing a shape of the display panel by applying an external force to the guide film, and aligning a second side of the display panel opposite to the first side toward the cover window to attach the cover window to the display panel.

In an embodiment, the display panel may include a main display area, a first subsidiary display area, a second subsidiary display area, and a corner display area, the first subsidiary display area being connected to a first side of the main display area, the second subsidiary display area being connected to a second side intersecting the first side of the main display area, and the corner display area being arranged between the first subsidiary display area and the second subsidiary display area, and the changing the shape of the display panel may include bending the first subsidiary display area, the second subsidiary display area, and the corner display area with respect to the main display area of the display panel.

In an embodiment, an opening that exposes a portion of the first side of the display panel may be defined in the support film, and the method may further include bending a portion of the display panel that corresponds to the opening.

In an embodiment, a width of the guide film in a predetermined direction may be greater than a width of the support film in the predetermined direction.

These and/or other features will become apparent and more readily appreciated from the following detailed description of the embodiments, the accompanying drawings, and claims.

These general and specific features may be implemented by a system, a method, a computer program, or a combination of a certain system, method, and computer program.

BRIEF DESCRIPTION OF THE DRAWINGS

The above and other features, features, and advantages of predetermined embodiments of the invention will be more apparent from the following description taken in conjunction with the accompanying drawings, in which.

DETAILED DESCRIPTION

Figure 1:
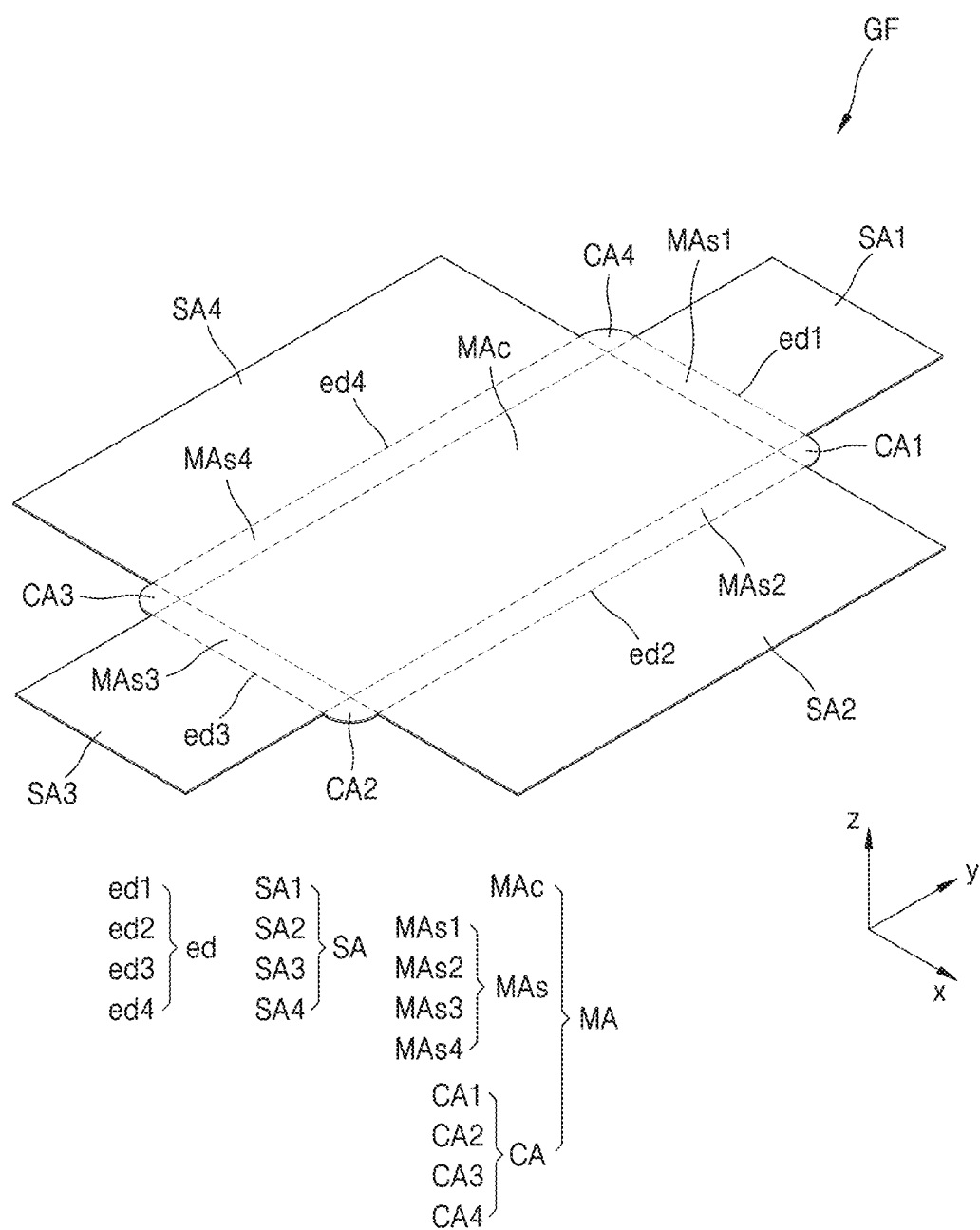
FIG. 1 is a perspective view of an embodiment of a guide film.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In the specification, "A and/or B" means A or B, or A and B. In the specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. The x-axis, the y-axis, and the z-axis may be perpendicular to one another, or may represent different directions that are not perpendicular to one another, for example.

Figure 2:
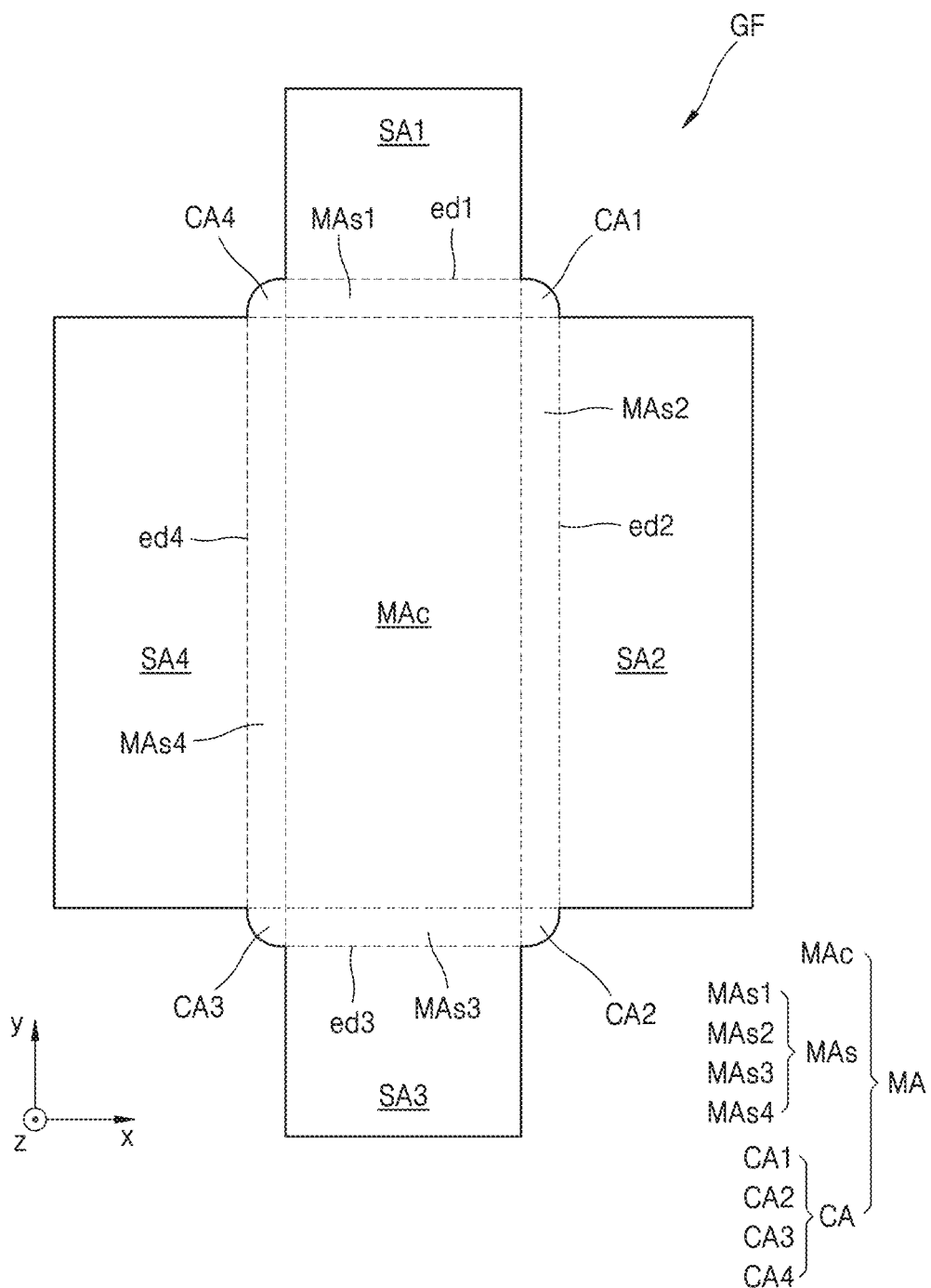
FIG. 2 is a plan view of an embodiment of a guide film.
Figure 3:
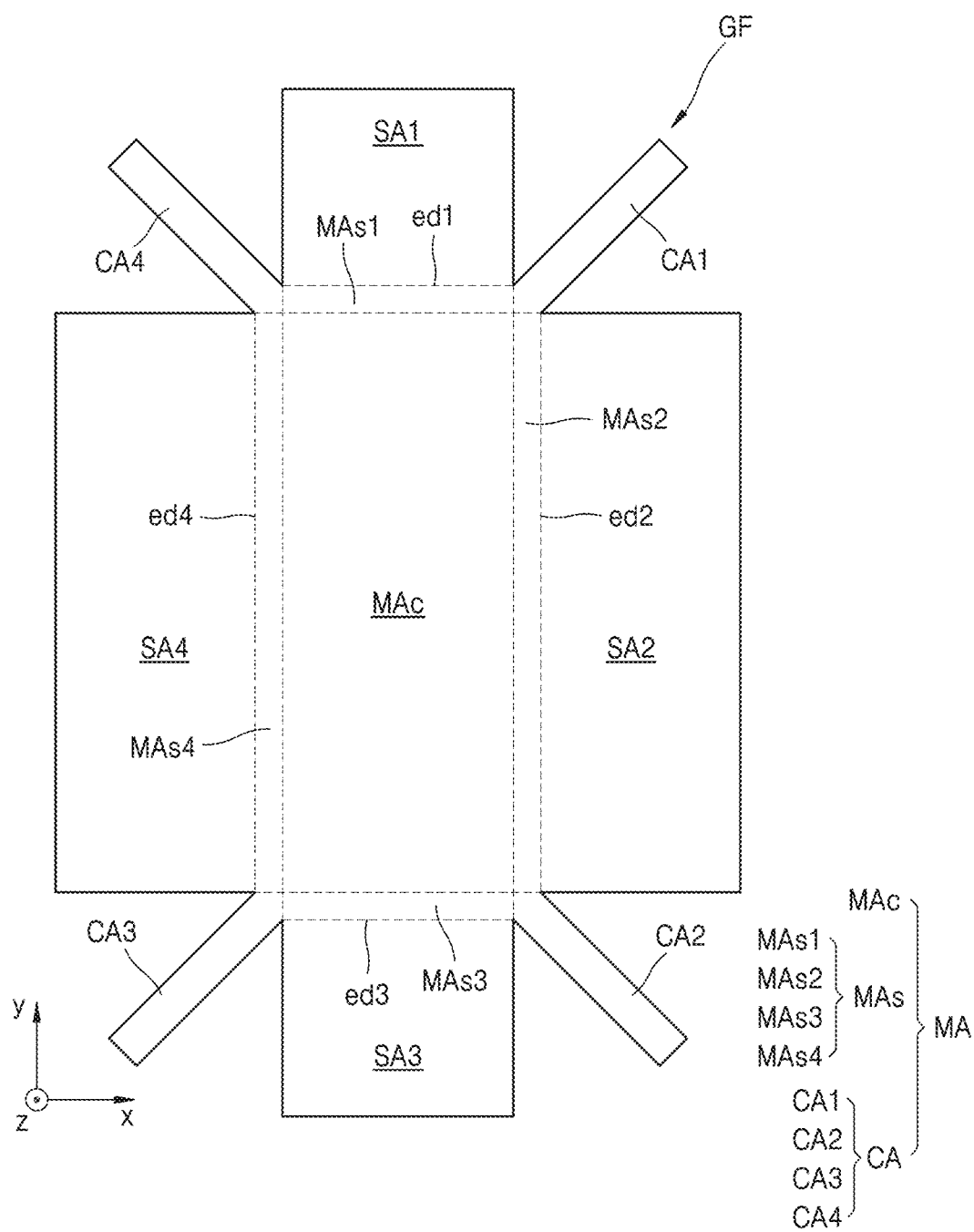
FIG. 3 is a plan view of another embodiment of a guide film.
Figure 4:
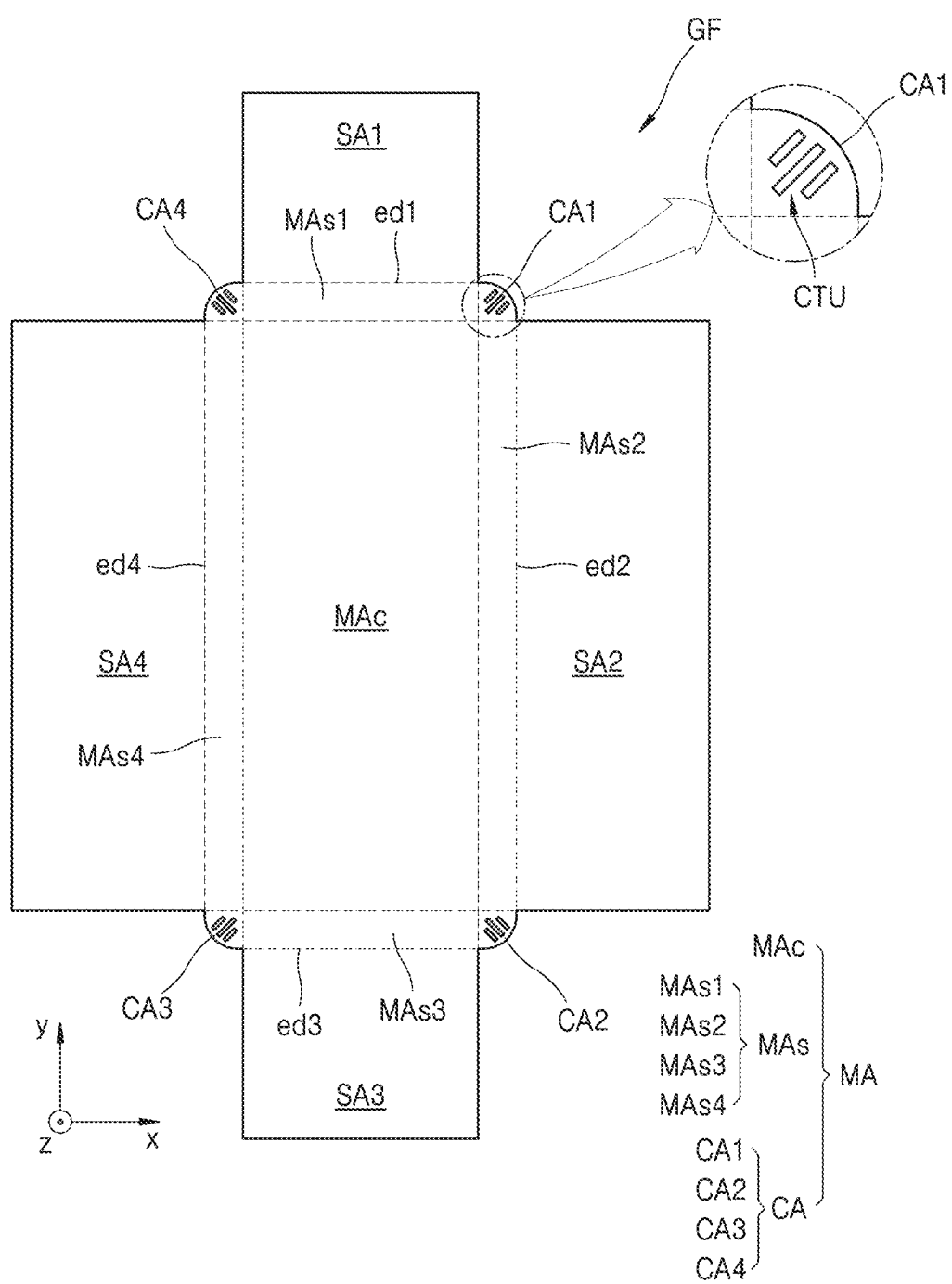
FIG. 4 is a plan view of another embodiment of a guide film.
Figure 5:
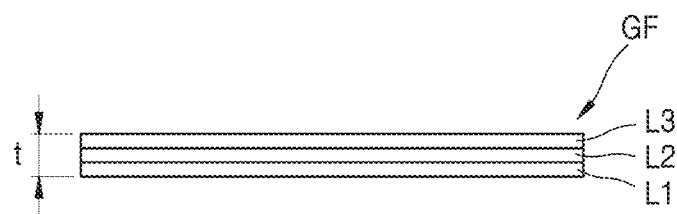
FIG. 5 is a cross-sectional view of an embodiment of a guide film.

FIG. 1 is a perspective view of an embodiment of a guide film, and FIG. 2 is a plan view of an embodiment of a guide film. FIG. 3 is a plan view of another embodiment of a guide film, and FIG. 4 is a plan view of another embodiment of a guide film. FIG. 5 is a cross-sectional view of an embodiment of a guide film.

Referring to FIG. 1, a guide film GF may include a main area MA and a subsidiary area SA.

The subsidiary area SA may be connected to an edge ed of the main area MA. The subsidiary area SA may extend from the edge ed of the main area MA.

The subsidiary area SA may be provided in plural. In an embodiment, the subsidiary area SA may include a first subsidiary area SA1, a second subsidiary area SA2, a third subsidiary area SA3, and a fourth subsidiary area SA4, the first subsidiary area SA1 being connected to a first edge ed1 of the main area MA, the second subsidiary area SA2 being connected to a second edge ed2 of the main area MA, the third subsidiary area SA3 being connected to a third edge ed3 of the main area MA, and the fourth subsidiary area SA4 being connected to a fourth edge ed4 of the main area MA. In this case, as shown in FIG. 1, the second edge ed2 may intersect the first edge ed1, the third edge ed3 may be parallel to the first edge ed1, and the fourth edge ed4 may be parallel to the second edge ed2.

The plurality of subsidiary areas SA may be apart from each other. The first subsidiary area SA1 may be apart from the second subsidiary area SA2, the third subsidiary area SA3, and the fourth subsidiary area SA4. The subsidiary area SA2 may be apart from the first subsidiary area SA1, the third subsidiary area SA3, and the fourth subsidiary area SA4. The third subsidiary area SA3 may be apart from the first subsidiary area SA1, the second subsidiary area SA2, and the fourth subsidiary area SA4. The fourth subsidiary area SA4 may be apart from the first subsidiary area SA1, the second subsidiary area SA2, and the third subsidiary area SA3.

The main area MA may include a central area MAc, a side area MAs, and a corner area CA.

The central area MAc corresponds to the central portion of the main area MA. As shown in FIG. 1, the central area MAc may have a quadrangular (e.g., rectangular) shape in a plan view in a direction (e.g. a z-direction) perpendicular to a main plane extension direction of the main area MA.

The side area MAs may be arranged between the central area MAc and the subsidiary area SA. The side area MAs may be provided in plural and arranged between the central area MAc and the plurality of subsidiary areas SA.

In an embodiment, the side area MAs may include a first side area MAs1, a second side area MAs2, a third side area MAs3, and a fourth side area MAs4. The first side area MAs1, the second side area MAs2, the third side area MAs3, and the fourth side area MAs4 may be respectively arranged between the central area MAc and the plurality of subsidiary areas SA. The first side area MAs1 may be arranged between the central area MAc and the first subsidiary area SA1, the second side area MAs2 may be arranged between the central area MAc and the second subsidiary area SA2, the third side area MAs3 may be arranged between the central area MAc and the third subsidiary area SA3, and the fourth side area MAs4 may be arranged between the central area MAc and the fourth subsidiary area SA4.

The corner area CA may be arranged at the corner of the main area MA. As described below in FIGS. 6A to 6L, a display panel 10 may be attached to correspond to the main area MA of the guide film GF. In this case, the corner area CA of the main area MA may correspond to a corner display area CDA of the display panel 10.

The corner area CA may be provided in plural and arranged at the corners of the main area MA. In addition, the corner area CA may connect the side areas MAs. In an embodiment, the corner area CA may include a first corner area CA1, a second corner area CA2, a third corner area CA3, and a fourth corner area CA4. The first corner area CA1, the second corner area CA2, the third corner area CA3, and the fourth corner area CA4 may be respectively arranged in the corners of the main area MA. The first corner area CA1 may connect the first side area MAs1 to the second side area MAs2, the second corner area CA2 may connect the second side area MAs2 to the third side area MAs3, the third corner area CA3 may connect the third side area MAs3 to the fourth side area MAs4, and the fourth corner area CA4 may connect the first side area MAs1 to the fourth side area MAs4.

The corner area CA may protrude between the subsidiary areas SA that are apart from each other. In an embodiment, the first corner area CA1 may protrude between the first subsidiary area SA1 and the second subsidiary area SA2, the second corner area CA2 may protrude between the second subsidiary area SA2 and the third subsidiary area SA3, the third corner area CA3 may protrude between the third subsidiary area SA3 and the fourth subsidiary area SA4, and the fourth corner area CA4 may protrude between the first subsidiary area SA1 and the fourth subsidiary area SA4.

In an embodiment, as shown in FIGS. 1 and 2, the edge of the corner area CA may be convex. The corner area CA may include a curve in an edge thereof and a straight line facing the side area MAs. The corner area CA may have a fan shape. Though it is shown in FIGS. 1 and 2 that the edge of the corner area CA is convex, the edge of the corner area CA may have various shapes. In an embodiment, as shown in FIG. 3, the edge of the corner area CA may have a straight line instead of a curve. The corner area CA may have a polygonal shape having one open side.

In addition, the corner area CA may protrude by various degrees. As shown in FIGS. 1 and 2, the corner area CA may protrude a little compared to the length of the subsidiary area SA, or protrude to be similar to the length of the subsidiary area SA as shown in FIG. 3. That is, a degree by which the corner area CA protrudes in a direction away from the center of the guide film GF may be various. As shown in FIGS. 1 and 2, the corner area CA may protrude a little in a direction away from the center of the guide film GF, and thus, the main area MA may have a round quadrangular (e.g., rectangular) shape in a plan view. In an alternative embodiment, as shown in FIG. 3, the corner area CA may protrude substantially in the direction away from the center of the guide film GF.

In an embodiment, as shown in FIG. 4, a cut portion CTU may be defined in the corner area CA. The cut portion CTU may be defined in plural. Though it is shown in FIG. 4 that three cut portions CTU are defined, the number of cut portions CTU may be more than three or less than three. In an embodiment, two cut portions CTU may be provided. In another embodiment, five cut portions CTU may be provided.

The size of the cut portion CTU may be various in addition to that shown in FIG. 4. In an embodiment, the size of the cut portion CTU may be similar to a pixel size inside the display panel.

The cut portion CTU may be defined inside the corner area CA and may have a closed-curve shape. Though it is shown in FIG. 4 that the cut portion CTU is defined inside the corner area CA, the cut portion CTU may be defined in the edge of the corner area CA. In this case, the cut portion CTU may have a shape having one open side instead of a closed-curve shape. A portion of the edge of the corner area CA may be removed through the cut portion CTU.

In the case where the cut portion CTU is defined in the corner area CA, a space may be defined inside the corner area CA. In this case, transformation of the corner area CA through the cut portion CTU may be easier. When external force is applied to the corner area CA, transformation of the corner area CA may be freely made.

In an embodiment, a modulus of the guide film GF may be about 1 megapascal (MPa) to about 50 MPa. The guide film GF may include silicon rubber. In an embodiment, the guide film GF may include a single layer of silicon rubber.

As described below with reference to FIGS. 6A to 6L, the guide film GF may be used to transform the shape of the display panel 10. The shape of the display panel 10 may be transformed by attaching the display panel 10 on the guide film GF and applying external force to the guide film GF.

In the case where the guide film GF has a modulus less than about 1 MPa to about 50 MPa, transformation of the guide film GF becomes excessively free, and thus, it may be difficult to support the display panel 10. In addition, when pressure is applied to the guide film GF, a portion that is drastically folded may occur. In contrast, in the case where the guide film GF has a modulus greater than a modulus ranging from about 1 MPa to about 50 MPa, the guide film GF is not freely transformed, and thus, when the guide film GF receives shrinking force, the guide film GF is twisted and wrinkles may occur. As a result, wrinkles may not be prevented from occurring to a portion of the display panel, for example, the corner portion where the edges meet.

However, as in an embodiment, in the case where the guide film GF has a modulus of about 1 MPa to about 50 MPa, the guide film GF may support the display panel 10 while the shape of the display panel 10 is transformed. In addition, even while the shape of the display panel 10 is transformed by shrinking the guide film GF, wrinkles may be prevented from occurring to the shape of the display panel 10 due to the guide film GF.

This may be utilized particularly when forming a corner portion arranged in the corner of the display panel 10 and having a plurality of curvatures. While forming the corner portion of the display panel 10, there is an area in which the flat display panel 10 shrinks through the guide film GF, and thus, the guide film GF in which wrinkles due to shrinkage is prevented is desired. Therefore, in the case where the corner portion of the display panel 10 is provided by the guide film GF having a modulus of about 1 MPa to about 50 MPa, wrinkles of the corner portion may be prevented while the guide film GF is shrunk. As a result, the corner portion constituting a gentle curve may be provided.

In an embodiment, the main area MA including the corner area CA, the first subsidiary area SA1, the second subsidiary area SA2, the third subsidiary area SA3, and the fourth subsidiary area SA4 may be provided as one body.

The main area MA including the corner area CA, the first subsidiary area SA1, the second subsidiary area SA2, the third subsidiary area SA3, and the fourth subsidiary area SA4 may each have the same modulus. In an embodiment, the main area MA including the corner area CA, the first subsidiary area SA1, the second subsidiary area SA2, the third subsidiary area SA3, and the fourth subsidiary area SA4 may each have a modulus of about 1 MPa to about 50 MPa.

The main area MA including the corner area CA, the first subsidiary area SA1, the second subsidiary area SA2, the third subsidiary area SA3, and the fourth subsidiary area SA4 may each have the same material. In an embodiment, the main area MA including the corner area CA, the first subsidiary area SA1, the second subsidiary area SA2, the third subsidiary area SA3, and the fourth subsidiary area SA4 may each include silicon rubber. In the case where the guide film GF includes silicon rubber, a silicon adhesive may be used while the display panel 10 is attached to the guide film GF. The thickness of the guide film GF may be about 200 micrometers (μm) to about 400 μm. In another embodiment, the main area MA including the corner area CA, the first subsidiary area SA1, the second subsidiary area SA2, the third subsidiary area SA3, and the fourth subsidiary area SA4 may each have polyethylene terephthalate ("PET"). In the case where the guide film GF includes PET, an ultraviolet ("UV") adhesive may be used while the display panel 10 is attached to the guide film GF.

In another embodiment, the main area MA including the corner area CA, the first subsidiary area SA1, the second subsidiary area SA2, the third subsidiary area SA3, and the fourth subsidiary area SA4 may each be separated from each other. The main area MA including the corner area CA, the first subsidiary area SA1, the second subsidiary area SA2, the third subsidiary area SA3, and the fourth subsidiary area SA4 may not be provided as one body. In the case where the main area MA, the first subsidiary area SA1, the second subsidiary area SA2, the third subsidiary area SA3, and the fourth subsidiary area SA4 each are separated from each other, the main area MA, the first subsidiary area SA1, the second subsidiary area SA2, the third subsidiary area SA3, and the fourth subsidiary area SA4 may be connected through connectors (not shown).

The main area MA including the corner area CA, the first subsidiary area SA1, the second subsidiary area SA2, the third subsidiary area SA3, and the fourth subsidiary area SA4 may respectively have different moduli. In an embodiment, a modulus of the main area MA may be less than a modulus of the first subsidiary area SA1. The modulus of the main area MA may be less than a modulus of the second subsidiary area SA2. The modulus of the main area MA may be less than a modulus of the third subsidiary area SA3. The modulus of the main area MA may be less than a modulus of the fourth subsidiary area SA4. In an embodiment, the modulus of the main area MA attached to the display panel 10 may be about 1 MPa to about 50 MPa. A modulus of the subsidiary areas SA may be about 680 MPa to about 2040 MPa.

The main area MA, the first subsidiary area SA1, the second subsidiary area SA2, the third subsidiary area SA3, and the fourth subsidiary area SA4 may respectively have different moduli, and thus, materials of the main area MA, the first subsidiary area SA1, the second subsidiary area SA2, the third subsidiary area SA3, and the fourth subsidiary area SA4 may be different from each other. In an embodiment, the main area MA to which the display panel 10 is attached may include silicon rubber, and the subsidiary areas SA may include PET. This case may be more economical than the case where both the main area MA and the subsidiary area SA include silicon rubber. The main area MA including the corner area CA includes silicon rubber and thus may support the display panel 10 as described above, and wrinkles may be prevented from occurring to the shape of the display panel 10 due to the guide film GF.

In an embodiment, the guide film GF may have a multi-layered structure. That is, the main area MA may have a multi-layered structure, and the subsidiary areas SA may have the same layered structure as the layered structure of the main area MA. In an embodiment, as shown in FIG. 5, the guide film GF may include a first layer L1, a third layer L3, and a second layer L2 between the first layer L1 and the third layer L3. The guide film GF may include the first layer L1, the second layer L2, and the third layer L3 that are sequentially stacked. Though not shown in FIG. 5, an adhesive or a gluing agent may be arranged between the first layer L1 and the second layer L2, and between the second layer L2 and the third layer L3.

The first layer L1, the second layer L2, and the third layer L3 may respectively have different moduli. In an embodiment, a modulus of the first layer L1 may be less than a modulus of the third layer L3. A modulus of the second layer L2 may be less than a modulus of the third layer L3. The modulus of the third layer L3 may be highest. In the case where a plurality of layers having different moduli is stacked, a finally applied modulus follows a highest modulus from among moduli of the plurality of layers. Accordingly, in the case where the modulus of the third layer L3 is highest, a modulus of the guide film GF including the first layer L1, the second layer L2, and the third layer L3 may be the same as the modulus of the third layer L3. Though the modulus of the third layer L3 is highest as an example, the modulus of the first layer L1 or the second layer L2 may be highest.

A modulus of a layer having a highest modulus from among the plurality of layers may be about 1 MPa to about 50 MPa. In this case, the modulus of the guide film GF may be about 1 MPa to about 50 MPa. Accordingly, as described above, the display panel 10 may be supported by the guide film GF, and wrinkles may be prevented from occurring to the shape of the display panel 10 due to the guide film GF.

Though it is shown in FIG. 5 that the guide film GF includes three layers, the number of layers included in the guide film GF may be various. In an embodiment, the guide film GF may include two layers or four layers. In another embodiment, the guide film GF may have a single-layered structure including one layer.

In an embodiment, a total thickness t of the guide film GF may be about 200 μm to about 400 μm.

In the case where a total thickness of the guide film GF is less than about 200 μm or greater than about 400 μm, when pressure is applied to the guide film GF, the guide film GF may not spread but may shrink, and thus, wrinkles may occur.

However, in the case where the total thickness t of the guide film GF is about 200 μm to about 400 μm as in an embodiment, even when pressure is applied, wrinkles do not occur to the guide film GF.

FIGS. 6A to 6L are views showing a method of manufacturing a display apparatus. In an embodiment, a method of transforming the shape of the display panel 10 by the guide film GF is sequentially shown.

Figure 6A:
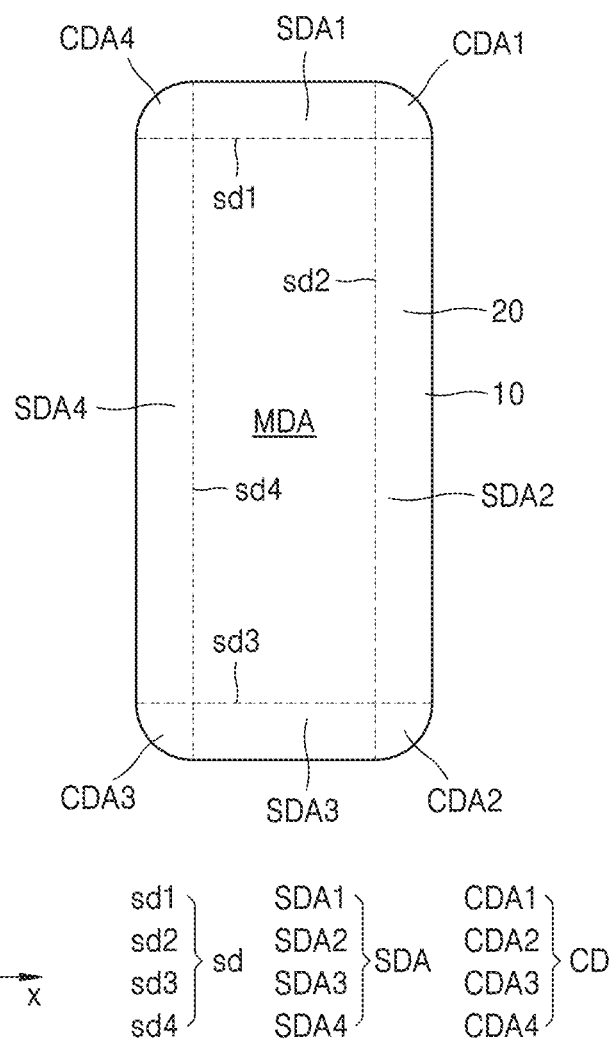
FIGS. 6A to 6L are views showing an embodiment of a method of manufacturing a display apparatus.

Referring to FIG. 6A, the display panel 10 is prepared.

The display panel 10 may include a main display area MDA, a subsidiary display area SDA, and a corner display area CDA. Though not shown in FIG. 6A, in addition to the main display area MDA, the subsidiary display area SDA, and the corner display area CDA, the display panel 10 may further include a peripheral area arranged outside the corner display area CDA and in which pixels are not arranged.

The subsidiary display area SDA may be connected to a side sd of the main display area MDA. The subsidiary display area SDA may extend from the side sd of the main display area MDA.

The subsidiary display area SDA may be provided in plural. In an embodiment, the subsidiary display area SDA may include a first subsidiary display area SDA1, a second subsidiary display area SDA2, a third subsidiary display area SDA3, and a fourth subsidiary display area SDA4, the first subsidiary display area SDA1 being connected to a first side sd1 of the main display area MDA, the second subsidiary display area SDA2 being connected to a second side sd2 of the main display area MDA, the third subsidiary display area SDA3 being connected to a third side sd3 of the main display area MDA, and the fourth subsidiary display area SDA4 being connected to a fourth side sd4 of the main display area MDA.

The corner display area CDA may be connected to the corner of the main display area MDA. The corner display area CDA may extend from the corner of the main display area MDA. The corner display area CDA may be arranged between adjacent ones of a plurality of subsidiary display areas SDA.

In an embodiment, the corner display area CDA may include a first corner display area CDA1, a second corner display area CDA2, a third corner display area CDA3, and a fourth corner display area CDA4. The first corner display area CDA1, the second corner display area CDA2, the third corner display area CDA3, and the fourth corner display area CDA4 may each be connected to the corner of the main display area MDA. The first corner display area CDA1 may be arranged between the first subsidiary display area SDA1 and the second subsidiary display area SDA2, the second corner display area CDA2 may be arranged between the second subsidiary display area SDA2 and the third subsidiary display area SDA3, the third corner display area CDA3 may be arranged between the third subsidiary display area SDA3 and the fourth subsidiary display area SDA4, and the fourth corner display area CDA4 may be arranged between the first subsidiary display area SDA1 and the fourth subsidiary display area SDA4.

Figure 6B:
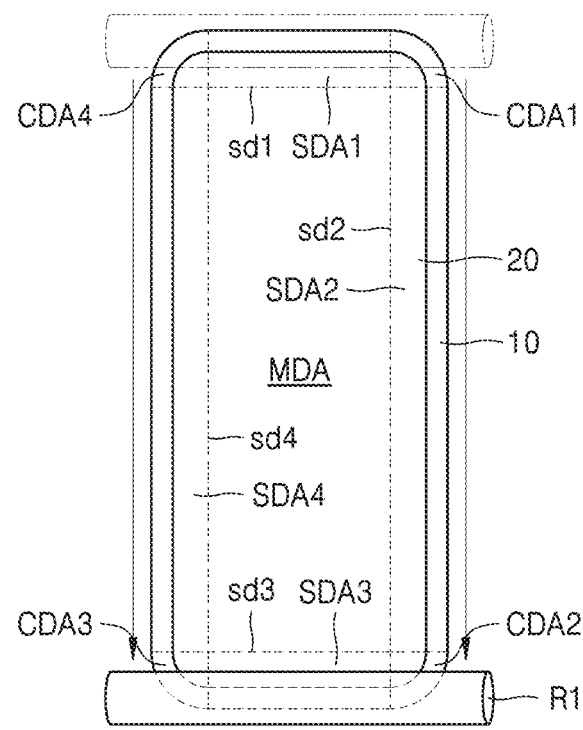
Figure 6B:
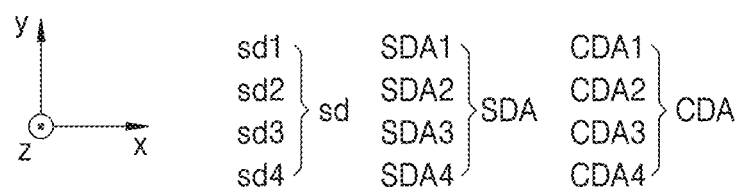
Figure 6C:
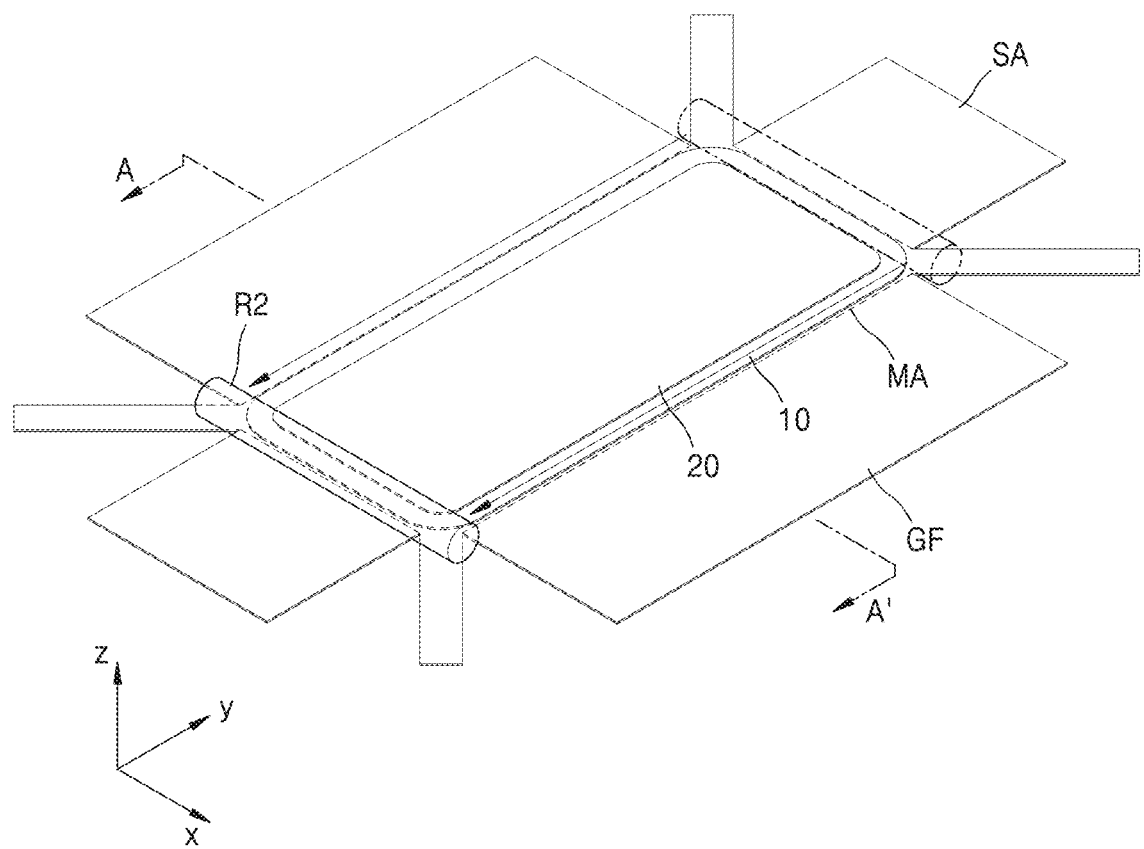
Figure 6D:
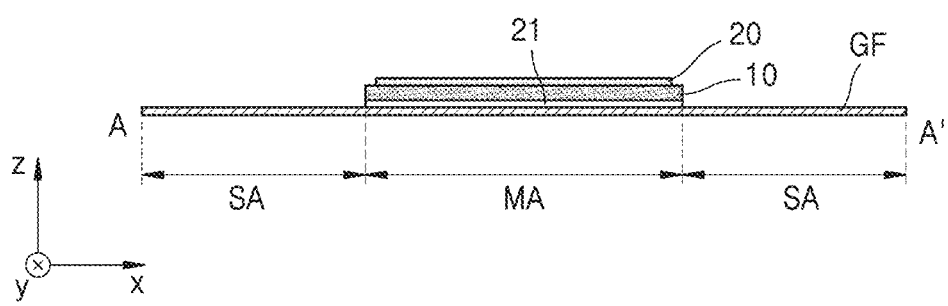
Figure 6E:
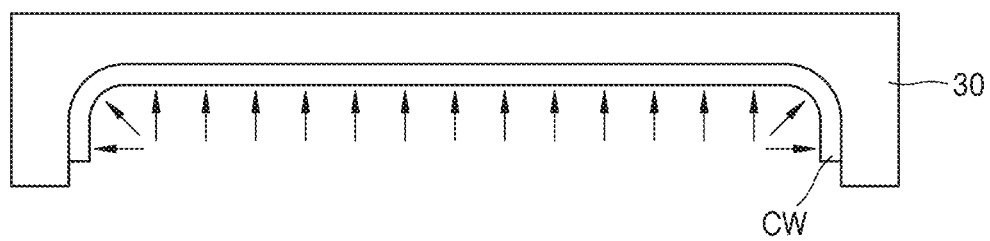
Figure 6F:
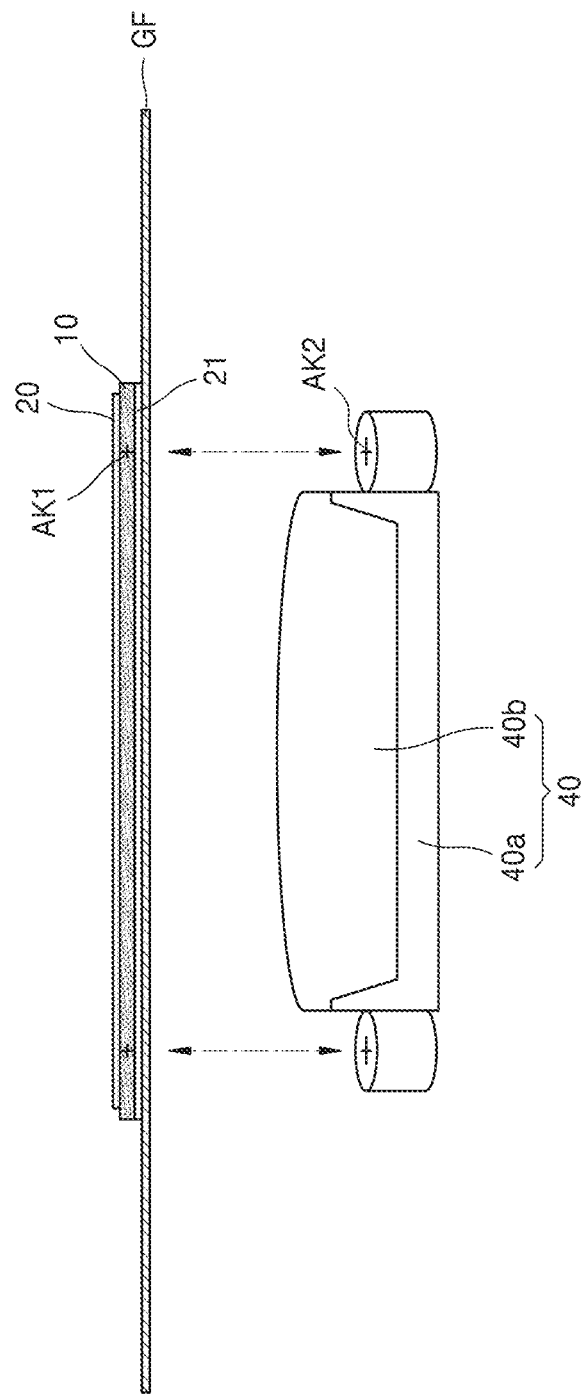
Figure 6G:
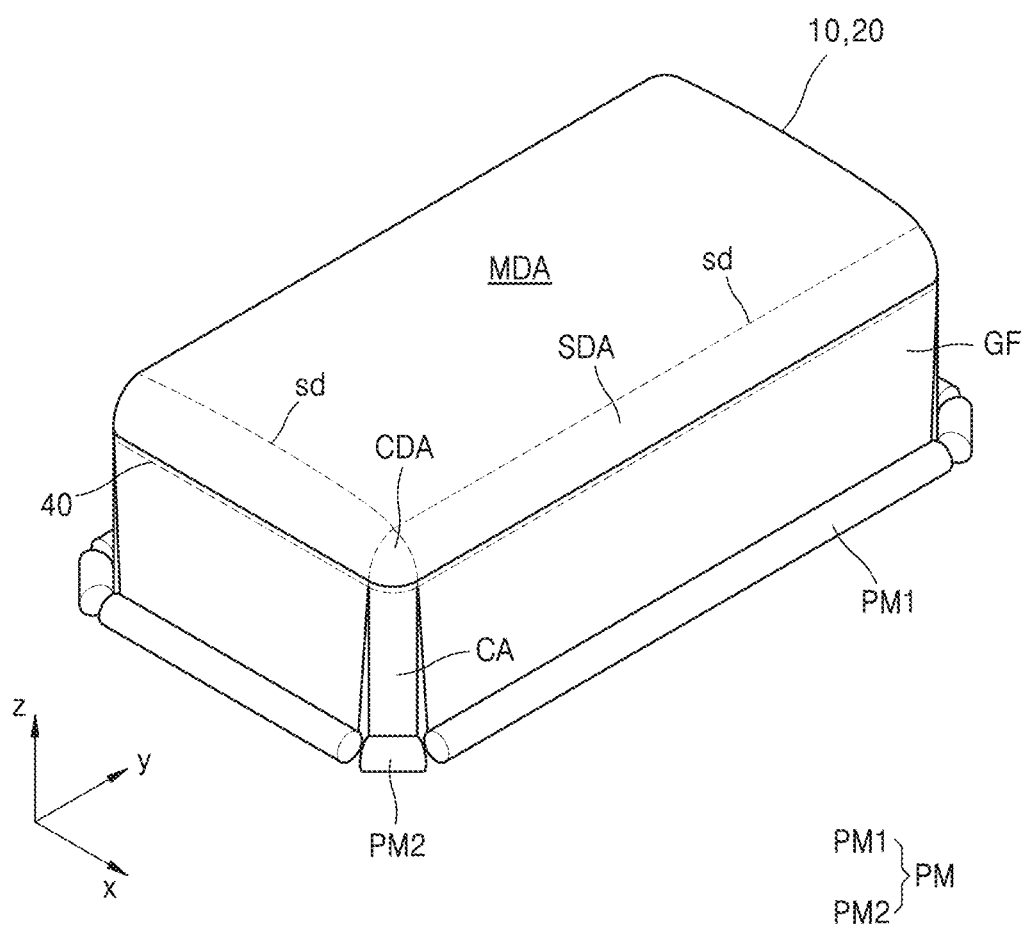
Figure 6H:
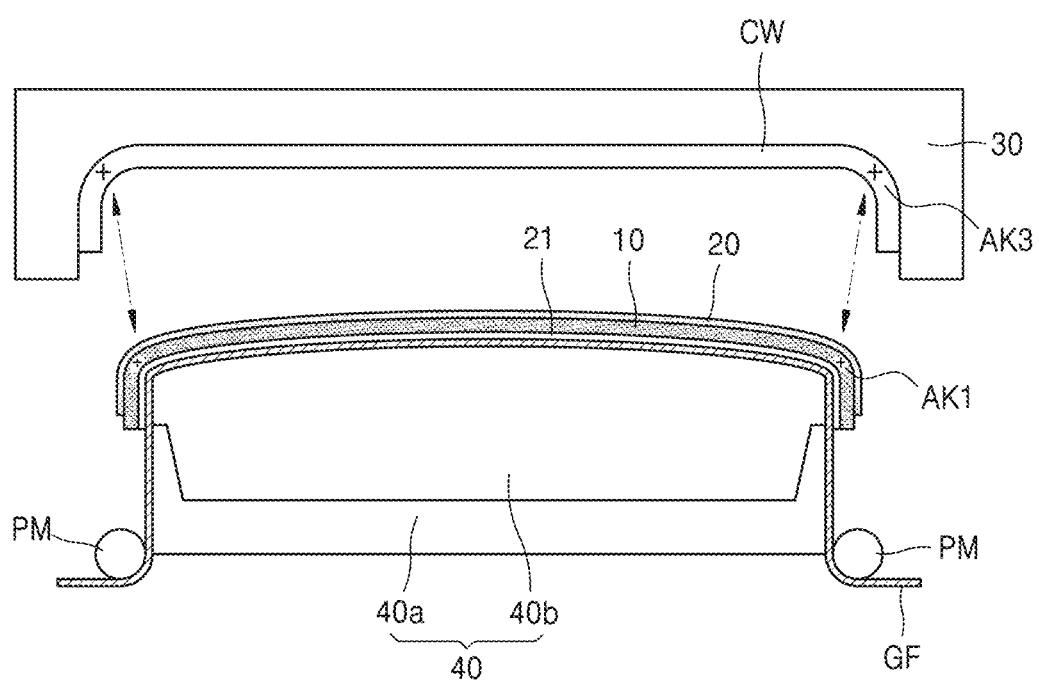

Referring to FIG. 6B, an operation of attaching a first adhesive layer 20 to the front surface (e.g. a surface facing a cover window in a (+) z-direction as shown in FIG. 6H) of the display panel 10 is performed.

The first adhesive layer 20 may be a transparent adhesive member such as an optically clear adhesive ("OCA") film. In an embodiment, the first adhesive layer 20 may include an acryl-based OCA film, for example.

While the first adhesive layer 20 is attached to the display panel 10, a first roller R1 may be used. While the first roller R1 is moved in a first direction (e.g. a direction that progresses from the top end of the display panel 10 to the bottom end), pressure may be applied such that the first adhesive layer 20 is properly attached to the display panel 10.

Next, referring to FIGS. 6C and 6D, an operation of attaching the guide film GF to the bottom surface (e.g. a (−) z-direction) of the display panel 10 with the first adhesive layer 20 attached on the front surface of the display panel 10 is performed. Here, FIG. 6D is a cross-sectional view of the guide film GF and the display panel 10 of FIG. 6C taken along line A-A'.

In an embodiment, the guide film GF attached on the bottom surface of the display panel 10 may be the guide film GF shown in FIGS. 1 to 5. Hereinafter, the case where the guide film GF is the guide film GF shown in FIG. 3 is mainly described.

A modulus of the guide film GF attached to the bottom surface of the display panel 10 may be about 1 MPa to about 50 MPa. The guide film GF attached to the bottom surface of the display panel 10 may include silicon rubber.

Referring to FIG. 6D, a second adhesive layer 21 may be arranged between the bottom surface of the display panel 10 and the guide film GF. The guide film GF may be attached to the bottom surface of the display panel 10 through the second adhesive layer 21. The second adhesive layer 21 may be a transparent adhesive member such as an OCA film. In an embodiment, the second adhesive layer 21 may include a silicon-based OCA film, for example.

While the guide film GF is attached to the bottom surface of the display panel 10, the guide film GF is attached to the bottom surface of the display panel 10 such that the bottom surface of the display panel 10 corresponds to the main area MA of the guide film GF. The guide film GF is attached to the bottom surface of the display panel 10 such that all of the main display area MDA, the subsidiary display area SDA, and the corner display area CDA of the display panel 10 correspond to the main area MA of the guide film GF. The subsidiary area SA of the guide film GF may not overlap the display panel 10.

A second roller R2 may be used while the guide film GF is attached to the bottom surface of the display panel 10. While the second roller R2 is moved in the first direction (e.g. the direction that progresses from the top end of the display panel 10 to the bottom end), pressure may be applied such that the guide film GF is properly attached to the display panel 10.

Referring to FIG. 6E, a cover window CW is prepared.

An operation of preparing the cover window CW may be an operation of transforming the cover window CW to have curvatures by a jig 30 including a curved portion. The jig 30 may correspond to a frame having the shape of the display apparatus to be finally manufactured. The cover window CW is in close contact with the jig 30, and thus, may be transformed according to the shape of the jig 30.

Referring to FIGS. 6F and 6G, the shape of the display panel 10 is transformed by applying external force to the guide film GF. The display panel 10 is preliminarily provided.

First, as shown in FIG. 6F, the bottom surface of the display panel 10 on which the guide film GF is attached faces a pad portion 40, and then the display panel 10 is aligned with the pad portion 40. The display panel 10 is aligned with the pad portion 40 such that a first align key AK1 marked on the display panel 10 coincides with a second align key AK2 marked on the pad portion 40.

Next, as shown in FIG. 6G, the guide film GF attached on the bottom surface of the display panel 10 is seated on the pad portion 40. A push member PM may be arranged on the guide film GF. The guide film GF is in close contact with the lateral surface of the pad portion 40 by the push member PM. As a result, the display panel 10 may be preliminarily provided in a shape matching the cover window CW.

In an embodiment, a first push member PM1 may be arranged in the subsidiary area SA of the guide film GF, and a second push member PM2 may be arranged in the corner area CA of the guide film GF. The second push member PM2 may be omitted depending on the cases.

External force may be applied to the guide film GF seated on the pad portion 40 through the push member PM. External force may be applied to the subsidiary area SA of the guide film GF through the first push member PM1, and external force may be applied to the corner area CA of the guide film GF through the second push member PM2.

The guide film GF may be bent through the external force applied to the guide film GF. In an embodiment, the main area MA of the guide film GF may be transformed to have curvatures. In the case where the guide film GF is transformed through external force, the shape of the display panel 10 attached to the main area MA of the guide film GF may be transformed together. In an embodiment, as shown in FIG. 6G, the subsidiary display area SDA and the corner display area CDA of the display panel 10 may be transformed to have a curvature. Particularly, the corner display area CDA may shrink while the subsidiary display areas SDA that neighbor the corner display area CDA are bent. The display panel 10 that is preliminarily provided may be divided into a region including a curvature and a region not including a curvature based on each side sd of the main display area MDA.

As a result of preliminarily forming the display panel 10, the subsidiary display area SDA and the corner display area CDA of the display panel 10 may be arranged on the same side with respect to the main display area MDA. In an embodiment, as shown in FIG. 6G, the subsidiary display area SDA and the corner display area CDA of the display panel 10 may be arranged on the bottom surface (e.g. the (−) z-direction) of the display panel 10 with respect to the main display area MDA.

In an embodiment, the guide film GF may include the corner area CA and have a modulus of about 1 MPa to about 50 MPa. As described above, while the corner display area CDA of the display panel 10 is provided, the corner display area CDA receives shrinking force from the subsidiary display areas SDA neighboring the corner display area CDA. The corner display area CDA receives pressure. The guide film GF in an embodiment may be freely transformed due to external force applied to the guide film GF. In an embodiment, in the case where shrinking force is applied to the guide film GF, the guide film GF may be transformed without wrinkles, etc., occurring to a surface thereof.

Accordingly, in the case where the guide film GF is arranged under the corner display area CDA to transform the shape of the corner display area CDA, even though the guide film GF receives shrinking force, wrinkles, etc., do not occur on a surface thereof, and thus, wrinkles may be prevented from occurring to the corner display area CDA. As a result, the corner display area CDA constituting a gentle curve may be provided.

In addition, in the case where a protruding degree of the corner area CA of the guide film GF is similar to the length of the subsidiary area SA, external force may be applied to the corner area CA by the second push member PM2. In this case, the second push member PM2 fixes the shape of the corner area CA such that the shape of the corner area CA is not twisted before the display panel 10 is attached to the cover window CW.

Figure 6I:
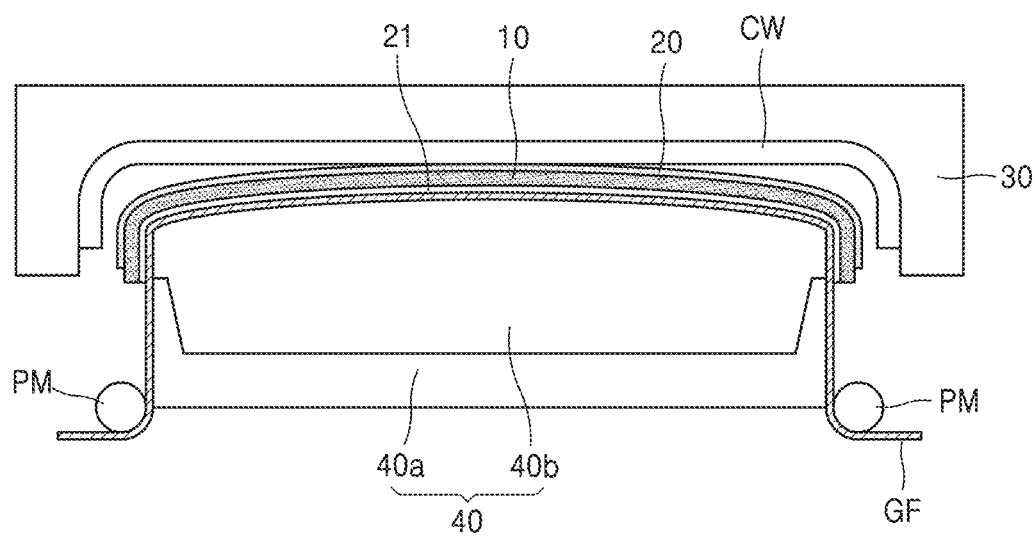
Figure 6J:
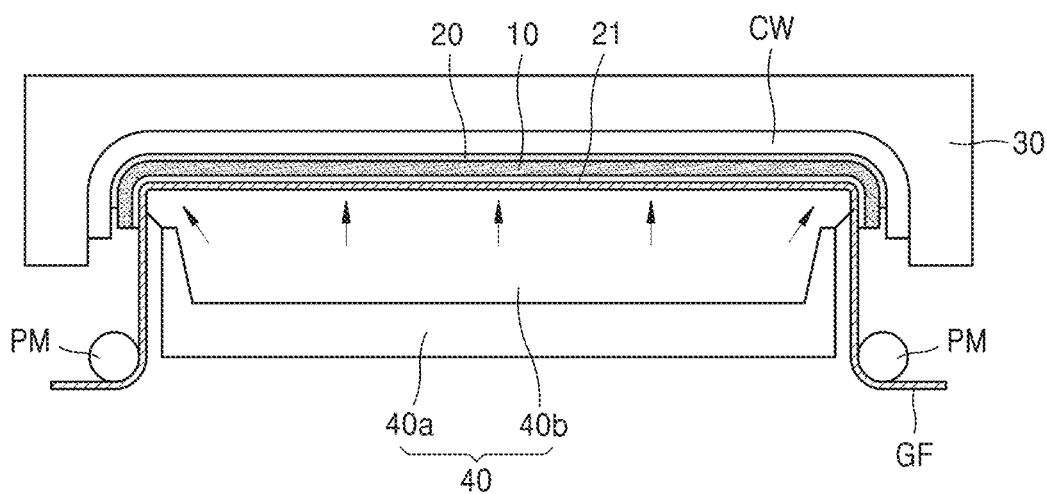

After the display panel 10 is preliminarily provided, referring to FIGS. 6H to 6J, an operation of attaching the cover window CW to the display panel 10 is performed.

First, as shown in FIG. 6H, the front surface of the display panel 10 faces the cover window CW, and then the display panel 10 is aligned with the cover window CW. The display panel 10 is aligned with the cover window CW such that the first align key AK1 marked on the display panel 10 coincides with a third align key AK3 marked on the cover window CW.

Next, as shown in FIGS. 6I and 6J, the cover window CW may be attached to the display panel 10 by the pad portion 40.

First, as shown in FIG. 6I, a portion of the main display area MDA, which is the central portion of the display panel 10, may be attached to the cover window CW. A flat surface (e.g. the main display area MDA) that does not have a curvature from among the final shape of the display panel 10 may be attached to the cover window CW on the first place.

In addition, as shown in FIG. 6J, the cover window CW may be attached to the subsidiary display area SDA and the corner display area CDA each having a curvature in the display panel 10. Operations of attaching the cover window CW to the subsidiary display area SDA and the corner display area CDA may be simultaneously performed. In an embodiment, while the subsidiary display area SDA is attached to the cover window CW, the corner display area CDA may be naturally attached to the cover window CW by surrounding external force. In another embodiment, operations of attaching the subsidiary display area SDA and the corner display area CDA to the cover window CW may be performed at different timings. In an embodiment, the subsidiary display area SDA is attached to the cover window CW, and then the corner display area CDA may be attached to the cover window CW.

The pad portion 40 may include a first pad portion 40a and a second pad portion 40b. The first pad portion 40a may be a jig supporting the second pad portion 40b. The second pad portion 40b may include an air pump or be connected to an air pump. The second pad portion 40b has a low modulus, and thus, the shape and volume of the second pad portion 40b may vary according to air pressure. The second pad portion 40b may include a diaphragm.

With the first adhesive layer 20 in contact with the cover window CW, the display panel 10 may be attached to the cover window CW by applying pressure through the second pad portion 40b.

While the cover window CW is attached to the display panel 10, the corner display area CDA may shrink while the subsidiary display areas SDA neighboring the corner display area CDA are bent. In an embodiment, the guide film GF may include the corner area CA and have a modulus of about 1 MPa to about 50 MPa. As described above, the guide film GF may be freely transformed by external force applied to the guide film GF. Accordingly, in the case where the guide film GF is arranged under the corner display area CDA, and the cover window CW is attached to the display panel 10, even though the guide film GF receives shrinking force, wrinkles, etc., do not occur to the surface of the guide film GF, and thus, wrinkles may be prevented from occurring to the corner display area CDA. As a result, the corner display area CDA constituting a gentle curve may be provided.

The operation of attaching the display panel 10 to the cover window CW is performed, and then, the display panel 10 to which the cover window CW is attached may be separated from the jig 30 and the pad portion 40.

Figure 6K:
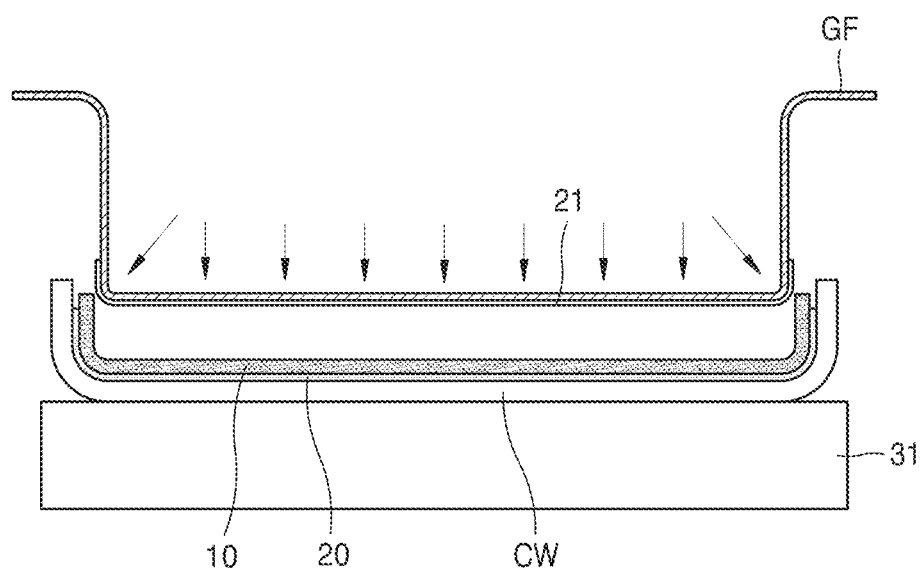

Next, as shown in FIG. 6K, the display panel 10 to which the cover window CW is attached may be reversed by 180 degrees)(° and arranged on a carrying shutter 31. In another embodiment, the next operation may be performed without turning the display panel 10 over.

Referring to FIG. 6K, an operation of separating the guide film GF from the display panel 10 is performed. In an embodiment, in the case where the second adhesive layer 21 to which the guide film GF and the display panel 10 are attached is implemented as a UV adhesive sheet, the guide film GF may be separated from the display panel 10 by irradiating a UV to the second adhesive layer 21. In an embodiment, when a UV is irradiated to the second adhesive layer 21, adhesive force between the second adhesive layer 21 and the display panel 10 is relatively weakened, and thus, the guide film GF may be separated from the display panel 10. Though it is shown in FIG. 6K that adhesive force between the second adhesive layer 21 and the display panel 10 is relatively weakened, and thus, the second adhesive layer 21 remains on the guide film GF, adhesive force between the second adhesive layer 21 and the guide film GF may be relatively weakened. In this case, the second adhesive layer 21 may remain on the display panel 10.

Figure 6L:
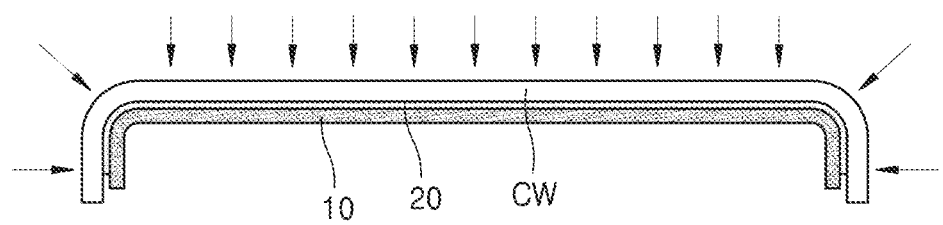

After the guide film GF is separated from the display panel 10, referring to FIG. 6L, an operation of hardening the cover window CW attached to the display panel 10 is performed. In an embodiment, the hardening may be performed by irradiating a UV to the cover window CW and the display panel 10. When a UV is irradiated to the cover window CW and the display panel 10, bubbles, etc., inside a film (not shown) attached to the first adhesive layer 20 and the display panel 10 may escape. Bubbles, etc., coming from a member such as a film, etc., attached to the first adhesive layer 20 and the display panel 10 may be removed in advance.

Figure 7A:
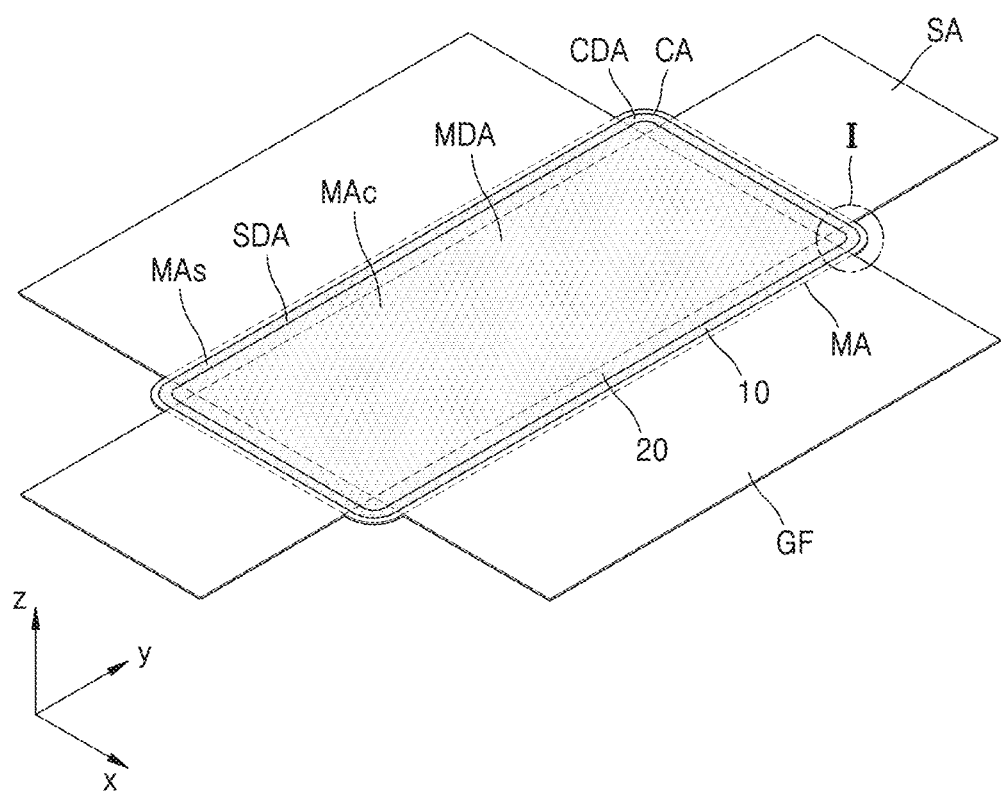
FIGS. 7AA and 7B are views showing another embodiment of a method of manufacturing a display apparatus, and FIG. 7AB is an enlarged view of a portion of FIG. 7AA.
Figure 7A:
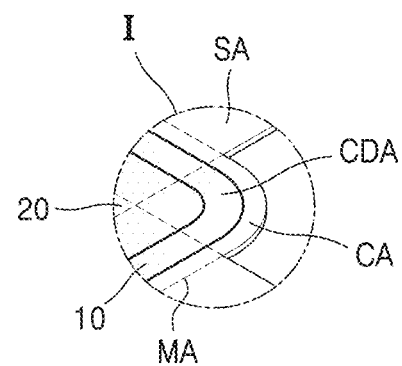

FIGS. 7AA and 7B are views showing another embodiment of a method of manufacturing a display apparatus, and FIG. 7AB is an enlarged view of a portion of FIG. 7AA. FIGS. 7AA and 7B correspond to some modified embodiments of FIGS. 6A to 6L, and thus, differences are mainly described below.

FIGS. 6A to 6L show that the display panel 10 has a curvature by the guide film GF shown in FIG. 3. Unlike this, FIGS. 7AA and 7B show that the display panel 10 has a curvature by the guide film GF shown in FIG. 2.

Referring to FIG. 7AA, the guide film GF is attached to the bottom surface (e.g. the (−) z-direction) of the display panel 10. A portion of the guide film GF to which the display panel 10 is attached corresponds to the main area MA. In an embodiment, the main display area MDA of the display panel 10 is attached to the central area MAc of the guide film GF, the subsidiary display area SDA of the display panel 10 is attached to the side area MAs of the guide film GF, and the corner display area CDA of the display panel 10 is attached to the corner area CA of the guide film GF. Referring to an enlarged view of FIG. 7AB, it is shown that the corner display area CDA of the display panel 10 is attached to correspond to the corner area CA of the guide film GF.

Figure 7B:
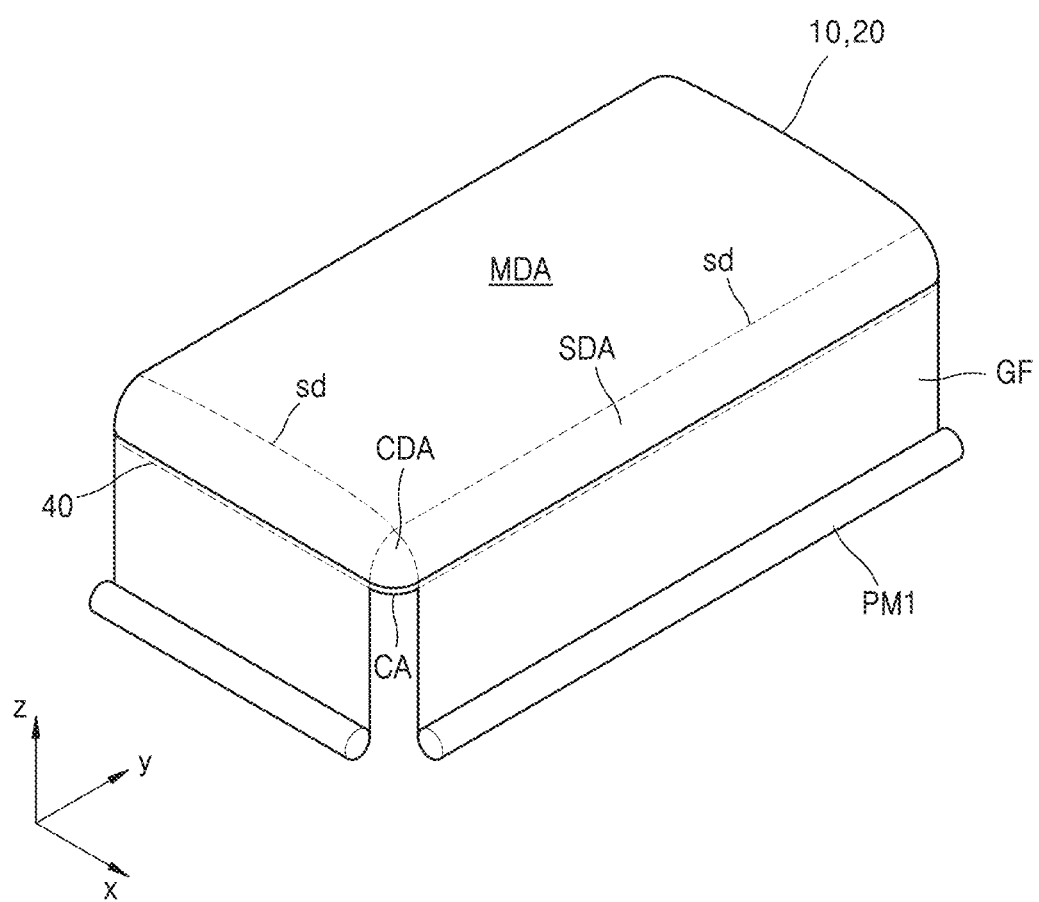

Referring to FIG. 7B, unlike FIG. 6G, the second push member PM2 may be omitted while the display panel 10 is preliminarily provided. In this case, external force due to the second push member PM2 is not applied to the corner area CA of the guide film GF. A degree of freedom of the corner area CA may be increased. Accordingly, in the case where the corner area CA of the guide film GF is arranged under the corner display area CDA of the display panel 10 and the shape of the corner display area CDA is transformed, the corner area CA is easily transformed, and thus, the corner display area CDA constituting a gentle curve may be provided.

FIGS. 8A to 8F are side views showing another embodiment of a method of manufacturing a display apparatus. In an embodiment, FIGS. 8A to 8F show other processes excluding a process of using the guide film in a method of manufacturing a display apparatus.

Figure 8A:
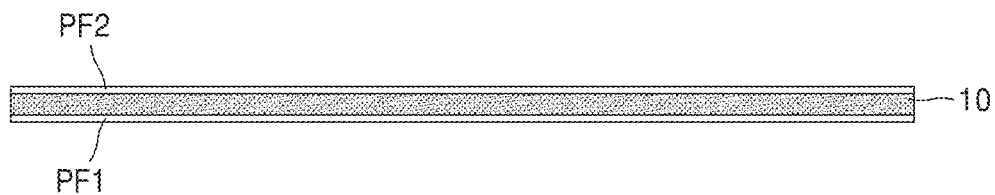
FIGS. 8A to 8F are side views showing another embodiment of a method of manufacturing a display apparatus.

First, referring to FIG. 8A, the display panel 10 is prepared. A first protective film PF1 and a second protective film PF2 are respectively attached to the bottom and the top of the display panel 10. The first protective film PF1 and the second protective film PF2 may protect the surface of the display panel 10. Here, the top of the display panel 10 denotes a direction in which light emitted from pixels of the display panel 10 progresses, and the bottom of the display panel 10 denotes the opposite direction. The top of the display panel 10 denotes the direction in which the cover window CW is attached.

Figure 8B:
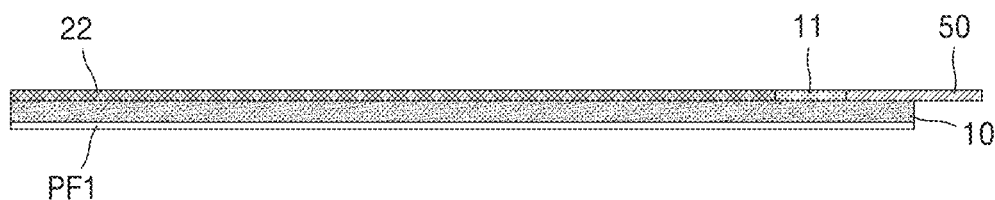

Referring to FIG. 8B, the second protective film PF2 attached to the top of the display panel 10 is removed, and then the first adhesive layer 22, a bending-protecting member 11, and a printed circuit board 50 are attached to the display panel 10. The first adhesive layer 22 may be a transparent adhesive member such as an OCA film. The first adhesive layer 22 may include an acryl-based OCA film. The bending-protecting member 11 may include a synthetic resin.

Figure 8C:
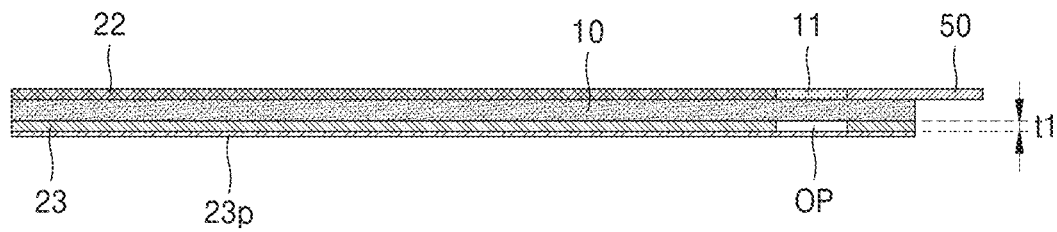

Next, referring to FIG. 8C, the first protective film PF1 attached to the bottom of the display panel 10 is removed, and then a second adhesive layer 23 is attached on the bottom surface of the display panel 10. The surface of the second adhesive layer 23 may be protected by an adhesive protection member 23p. The second adhesive layer 23 may be a transparent adhesive member such as an OCA film. The second adhesive layer 23 may include a silicon-based OCA film.

The second adhesive layer 23 may be patterned. An opening OP that exposes a portion of the bottom of the display panel 10 may be defined in the second adhesive layer 23. The opening OP of the second adhesive layer 23 may overlap the bending-protecting member 11. The opening OP of the second adhesive layer 23 may correspond to the bending-protecting member 11.

Though it is shown in FIGS. 8B and 8C that the second protective film PF2 is removed first and then the first protective film PF1 is removed, an order may be changed depending the cases. That is, the first protective film PF1 may be removed and then the second protective film PF2 may be removed, or the first protective film PF1 and the second protective film PF2 may be simultaneously removed.

Figure 8D:
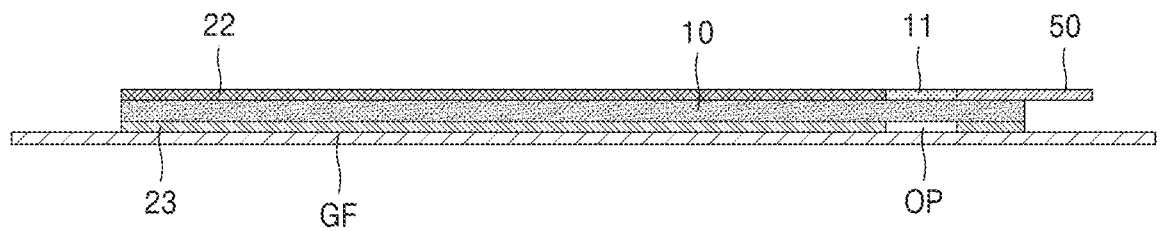

Referring to FIG. 8D, the first adhesive layer 22 and the second adhesive layer 23 are respectively disposed on the top and the bottom of the display panel 10. Next, the adhesive protection member 23p is removed, and then the guide film GF is attached to the second adhesive layer 23. The guide film GF is attached to the bottom of the display panel 10 by the second adhesive layer 23. In an embodiment, the guide film GF may be one of the guide films GF shown in FIGS. 1 to 5.

Though it is shown in FIG. 8D that the second adhesive layer 23 is attached to the display panel 10 first, and then the guide film GF is attached on the second adhesive layer 23, the order may be changed depending on the cases. In an embodiment, the second adhesive layer 23 may be attached to the guide film GF first, and then the second adhesive layer 23 to which the guide film GF is attached may be attached to the bottom surface of the display panel 10.

Figure 8E:
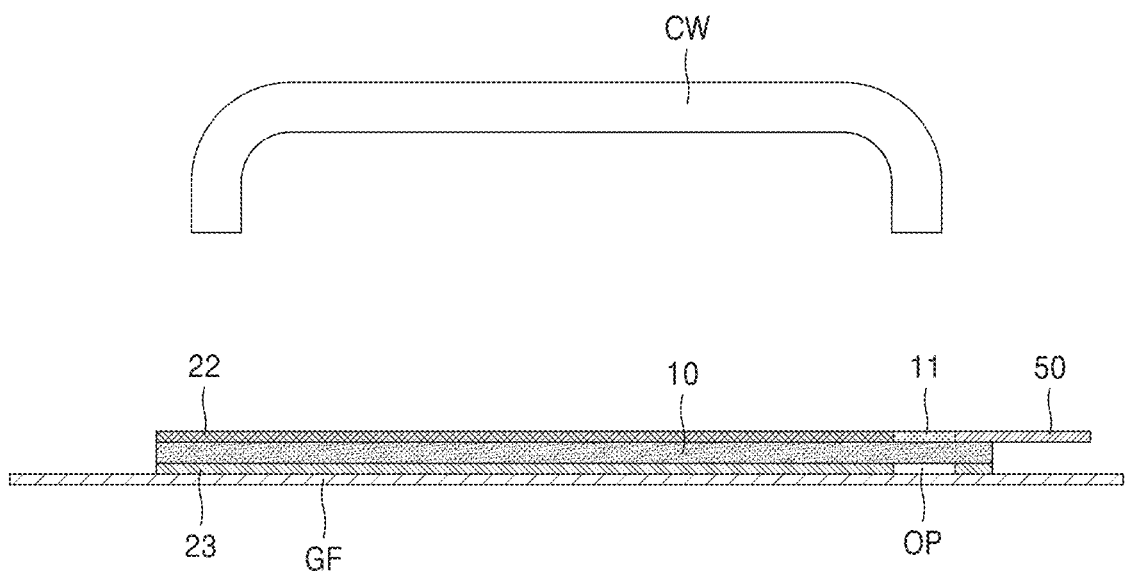
Figure 8F:
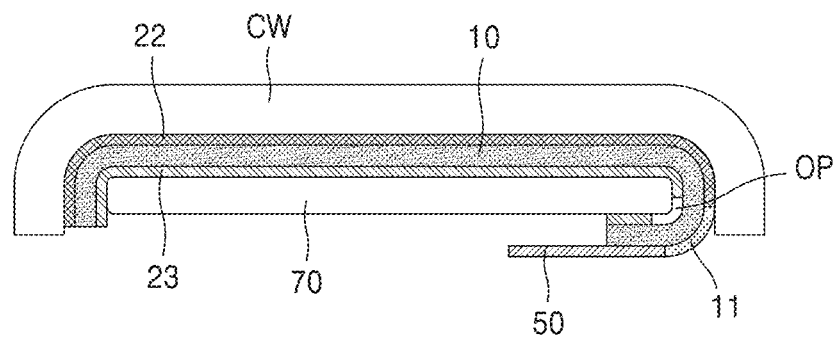

Referring to FIG. 8E, the display panel 10 is attached to the cover window CW. Before the display panel 10 is attached to the cover window CW, an operation of transforming the shapes of the display panel 10 and the cover window CW through the method described above in FIGS. 6E to 6G may be performed. Next, an operation of attaching the display panel 10 to the cover window CW may be performed through the method described above in FIGS. 6H to 6K. FIG. 8F shows the display panel 10 attached to the cover window CW. After the display panel 10 is attached to the cover window CW, the guide film GF may be removed.

Referring to FIG. 8F, an operation of bending a portion of the display panel 10 is performed. In an embodiment, an operation of bending a portion of the display panel 10 that corresponds to the opening OP of the second adhesive layer 23 is performed. The opening OP of the second adhesive layer 23 overlaps the bending-protecting member 11, and thus, it may be understood that a portion of the display panel 10 that corresponds to the bending-protecting member 11 is bent. While a portion of the display panel 10 that corresponds to the opening OP of the second adhesive layer 23 is bent, a space in which the display panel 10 may be transformed is provided through the opening OP of the second adhesive layer 23, and thus, the display panel 10 may be easily bent.

As shown in FIG. 8F, the display panel 10 is bent, and thus, portions of the display panel 10 may overlap each other. A portion of the display panel 10 on which the printed circuit board 50 is attached may be a non-display area. A partial region of the display panel 10 is bent, and thus, when the display panel 10 is viewed in a front side, the non-display area may not be viewed, or even through the non-display area is viewed, the non-display area that is viewed may be reduced.

In an embodiment, before a portion of the display panel 10 is bent, a panel-protecting member 70 may be arranged on the bottom surface of the display panel 10. The panel-protecting member 70 may be arranged on the bottom surface of the display panel 10 through an adhesive member. The adhesive member may be a pressure sensitive adhesive ("PSA"). The panel-protecting member 70 may protect the display panel 10 and dissipate heat emitted from the display panel 10 to the outside. The panel-protecting member 70 may include at least one of a light-absorbing layer, a cushion layer, and a heat-dissipating layer, the light-absorbing layer absorbing light incident from the outside, the cushion layer absorbing an external impact, and the heat-dissipating layer efficiently dissipating heat of the display panel 10.

The guide film GF in an embodiment may include the corner area CA and have a modulus of about 1 MPa to about 50 MPa. As described above, while the shape of the display panel 10 is transformed, a portion of the display panel 10 receives pressure. In an embodiment, the guide film GF may be freely transformed by external force applied to the guide film GF. Accordingly, in the case where the guide film GF is arranged under the display panel 10, and the shape of the display panel 10 is transformed, even though the guide film GF receives shrinking force, wrinkles, etc., do not occur to the surface of the guide film GF, and thus, wrinkles may be prevented from occurring to the display panel 10. Particularly, this is usefully applicable when forming the corner portion of the display panel 10.

FIGS. 9A to 9E are side views showing another embodiment of a method of manufacturing a display apparatus. In an embodiment, unlike FIGS. 8A to 8F, FIGS. 9A to 9E shows a method of manufacturing a display apparatus in the case where a support film that assists bending the display panel 10 is provided.

Figure 9A:
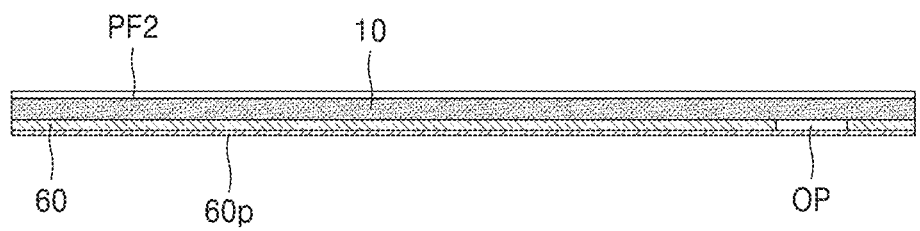
FIGS. 9A to 9E are side views showing another embodiment of a method of manufacturing a display apparatus.

First, referring to FIG. 9A, the display panel 10 is prepared. As described above in FIG. 8A, the first protective film PF1 and the second protective film PF2 may be respectively attached to the bottom and the top of the display panel 10. The first protective film PF1 and the second protective film PF2 may protect the surface of the display panel 10.

The first protective film PF1 attached to the bottom of the display panel 10 is removed, and then a support film 60 is attached to the bottom of the display panel 10. The surface of the support film 60 may be protected by a film protective member 60p.

In an embodiment, the support film 60 may be patterned. An opening OP that exposes a portion of the bottom surface of the display panel 10 may be defined in the support film 60.

Figure 9B:
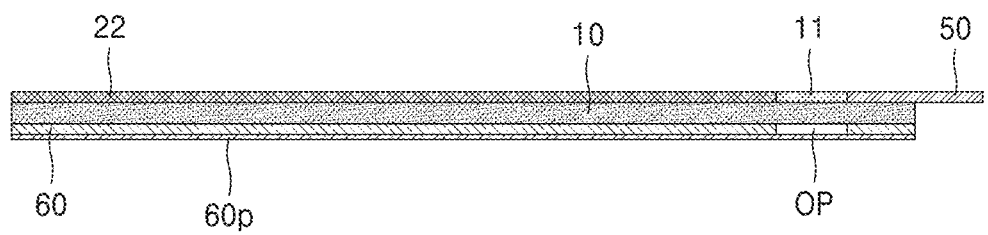

Referring to FIG. 9B, the second protective film PF2 attached to the top of the display panel 10 is removed, and then the first adhesive layer 22, the bending-protecting member 11, and the printed circuit board 50 are arranged on the display panel 10. The first adhesive layer 22 may be a transparent adhesive member such as an OCA film.

The bending-protecting member 11 may overlap the opening OP defined in the support film 60. The bending-protecting member 11 may correspond to the opening OP of the support film 60.

Figure 9C:
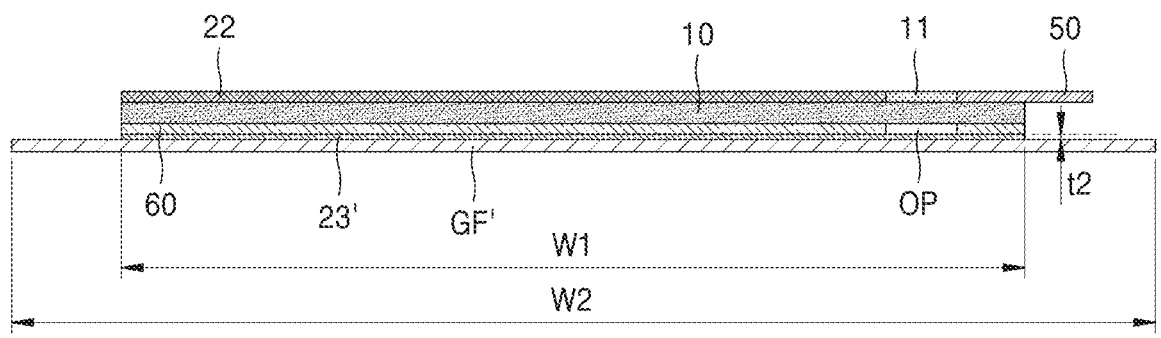

Though it is shown in FIGS. 9A and 9C that the first protective film PF1 is removed first and then the second protective film PF2 is removed, the order may be changed depending on the cases. That is, the second protective film PF2 may be removed first and then the first protective film PF1 may be removed, or the first protective film PF1 and the second protective film PF2 may be simultaneously removed.

Referring to FIG. 9C, the first adhesive layer 22 and the support film 60 are respectively disposed on the top and the bottom of the display panel 10, and then the film protective member 60p is removed, and then a guide film GF' is attached to the support film 60. The guide film GF' is attached in a direction of the support film 60 opposite to a direction of display panel 10. To attach the support film 60 to the guide film GF', a second adhesive layer 23' may be arranged between the support film 60 to the guide film GF'.

In an embodiment, the second adhesive layer 23' may have different thicknesses depending on a role thereof. The second adhesive layer 23 shown in FIG. 8C may protect the display panel 10 and assist the bending the display panel 10. The second adhesive layer 23' shown in FIG. 9C may attach the support film 60 to the guide film GF'. In this case, a first thickness t1 of the second adhesive layer 23 shown in FIG. 8C may be greater than a second thickness t2 of the second adhesive layer 23' shown in FIG. 9C. In an embodiment, the first thickness t1 of the second adhesive layer 23 shown in FIG. 8C may be about four times to about ten times greater than the second thickness t2 of the second adhesive layer 23' shown in FIG. 9C.

In an embodiment, the shape of the support film 60 may be the same as the shape of the display panel 10. The area of the support film 60 may be the same as the area of the display panel 10. The support film 60 may correspond to the display panel 10.

In an embodiment, a second width W2 of the guide film GF' in a first direction (e.g. a direction parallel to the display panel 10) may be greater than a first width W1 of the support film 60 in the first direction.

In an embodiment, the modulus of the support film 60 may be about 1 MPa to about 50 MPa. The support film 60 may include silicon rubber. The modulus of the guide film GF' may be about 680 MPa to about 2040 MPa. The guide film GF' may include PET. In this case, the guide film GF' may not include a protruding portion corresponding to the corner of the display panel 10. Accordingly, the guide film GF' having a modulus greater than a modulus from about 1 MPa to about 50 MPa is not attached to the corner of the display panel 10.

As a result, the shape of the corner portion corresponding to the corner of the display panel 10 may be transformed through the support film 60. The shape of the corner portion is transformed through the support film 60 which has a modulus of about 1 MPa to about 50 MPa and which is freely transformed, and thus, the shape of the corner portion may be transformed without occurrence of wrinkles, etc., due to pressure.

Figure 9D:
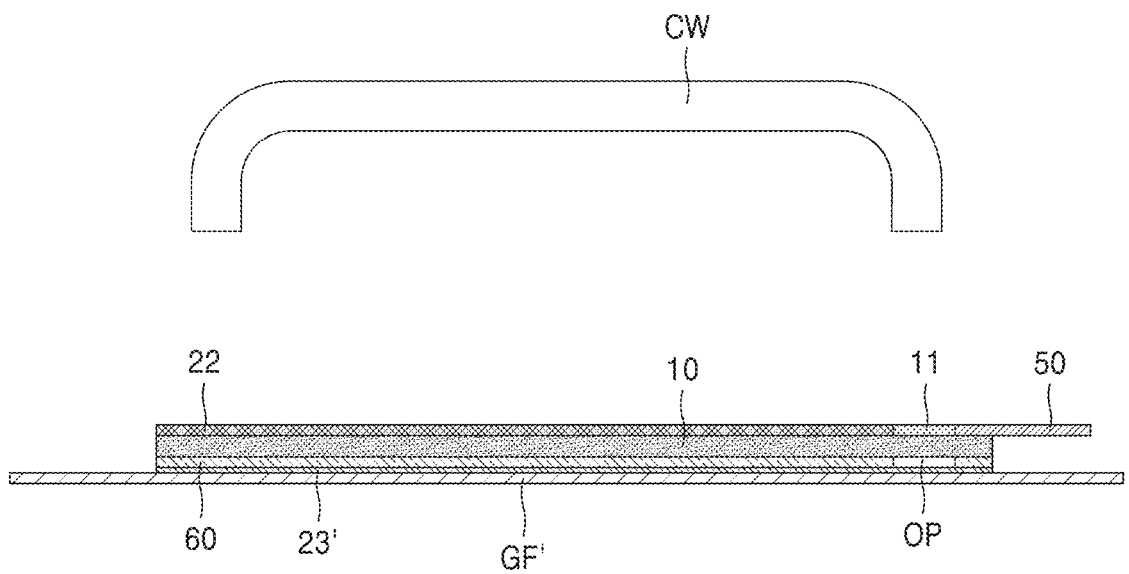
Figure 9E:
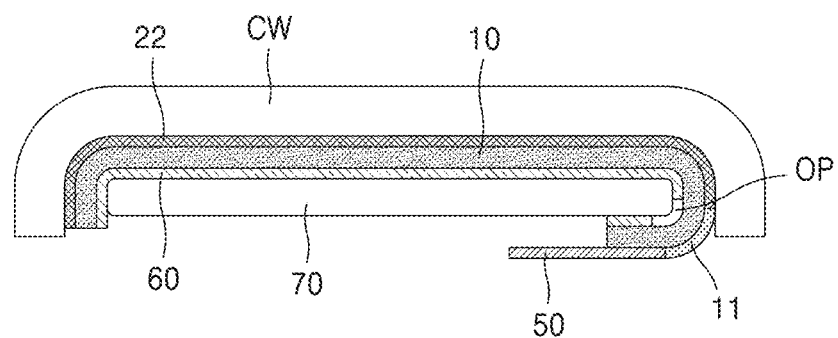

In another embodiment, the modulus of the guide film GF' may be about 1 MPa to about 50 MPa. In this case, the guide film GF' may or may not include a protruding portion. In an embodiment, the guide film GF' may be the guide film shown in FIGS. 1 to 5. Referring to FIG. 9D, the display panel 10 is attached to the cover window CW. Before the display panel 10 is attached to the cover window CW, an operation of transforming the shapes of the display panel 10 and the cover window CW through the method described above in FIGS. 6E to 6G may be performed. Next, an operation of attaching the display panel 10 to the cover window CW may be performed through the method described above in FIGS. 6H to 6K. FIG. 9E shows display panel 10 attached to the cover window CW. After the display panel 10 is attached to the cover window CW, the second adhesive layer 23' and the guide film GF' may be removed.

Referring to FIG. 9E, an operation of bending a portion of the display panel 10 is performed. In an embodiment, an operation of bending a portion of the display panel 10 that corresponds to the opening OP of the support film 60 is performed. The opening OP of the support film 60 overlaps the bending-protecting member 11, and thus, it may be understood that a portion of the display panel 10 that corresponds to the bending-protecting member 11 is bent. While a portion of the display panel 10 that corresponds to the opening OP of the support film 60 is bent, a space in which the display panel 10 may be transformed is defined through the opening OP of the support film 60, and thus, the display panel 10 may be easily bent.

As shown in FIG. 9E, the display panel 10 is bent, and thus, portions of the display panel 10 may overlap each other. A portion of the display panel 10 on which the printed circuit board 50 is attached may be a non-display area. A partial region of the display panel 10 is bent, and thus, when the display panel 10 is viewed in a front side, the non-display area may not be viewed, or even through the non-display area is viewed, the non-display area that is viewed may be reduced.

In an embodiment, before a portion of the display panel 10 is bent, the panel-protecting member 70 may be arranged on the bottom surface of the display panel 10. The panel-protecting member 70 may be arranged on the bottom surface of the display panel 10 through an adhesive member. The adhesive member may be a PSA. The panel-protecting member 70 may protect the display panel 10 and dissipate heat emitted from the display panel 10 to the outside. The panel-protecting member 70 may include at least one of a light-absorbing layer, a cushion layer, and a heat-dissipating layer, the light-absorbing layer absorbing light incident from the outside, the cushion layer absorbing an external impact, and the heat-dissipating layer efficiently dissipating heat of the display panel 10.

FIGS. 10A to 10E are side views showing another embodiment of a method of manufacturing a display apparatus. In an embodiment, unlike the method of manufacturing the display apparatus described above, FIGS. 10A to 10E show a method of forming the display panel 10 through heat without using the guide film.

Figure 10A:
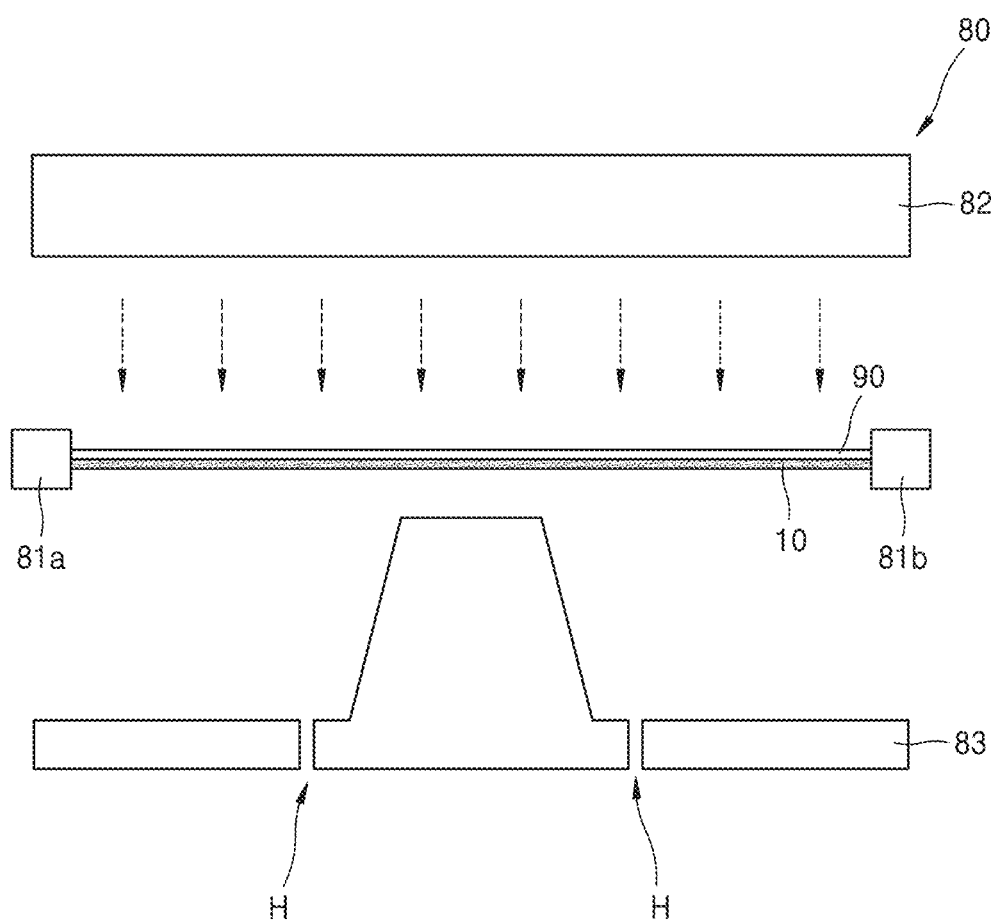
FIGS. 10A to 10E are side views showing another embodiment of a method of manufacturing a display apparatus.

Referring to FIG. 10A, an apparatus 80 for manufacturing the display apparatus may include a first clamp 81*a*, a second clamp 81*b*, a movable heater 82, and a mold 83.

The first clamp 81*a* and the second clamp 81*b* may fix or move an object. The movable heater 82 may heat an object. The mold 83 may transform the shape of an object. A plurality of holes H may be defined in the mold 83. Air, etc., may move through the plurality of holes H.

First, a molding film 90 is attached to the display panel 10. The molding film 90 may be attached to the display panel 10 to be close to the movable heater 82. In an embodiment, as shown in FIG. 10A, the movable heater 82 is arranged over the display panel 10, and thus, the molding film 90 may be attached on the display panel 10. In another embodiment, in the case where the movable heater 82 is arranged below the display panel 10, the molding film 90 may be attached on the bottom surface of the display panel 10. In an embodiment, the molding film 90 may be a resin film having a transparent sheet form including polymer compound such as PET, polymethylmethacrylate ("PMMA"), polyurethane ("PU"), and polycarbonate.

Next, two opposite ends of the display panel 10 to which the molding film 90 is attached are fixed by the first clamp 81*a* and the second clamp 81*b*. The display panel 10 to which the molding film 90 is attached is set in a stretched state such that the display panel 10 is pulled tight. Subsequently, the molding film 90 is heated by the movable heater 82. A heating temperature may be within a temperature range for forming a softening point of the molding film 90. When the molding film 90 is heated, the modulus of the molding film 90 is reduced, and transformation of the molding film 90 becomes easy. In contrast, in the case where the molding film 90 is cooled, the modulus of the molding film 90 increases, and the transformation of the molding film 90 becomes difficult.

Figure 10B:
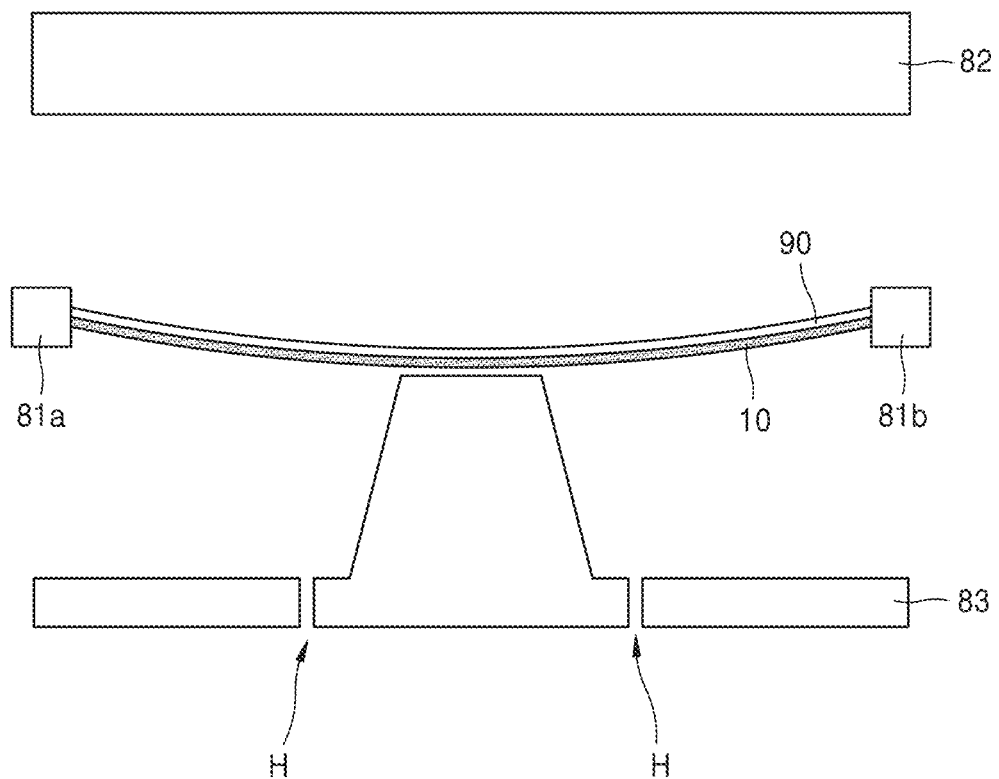
Figure 10C:
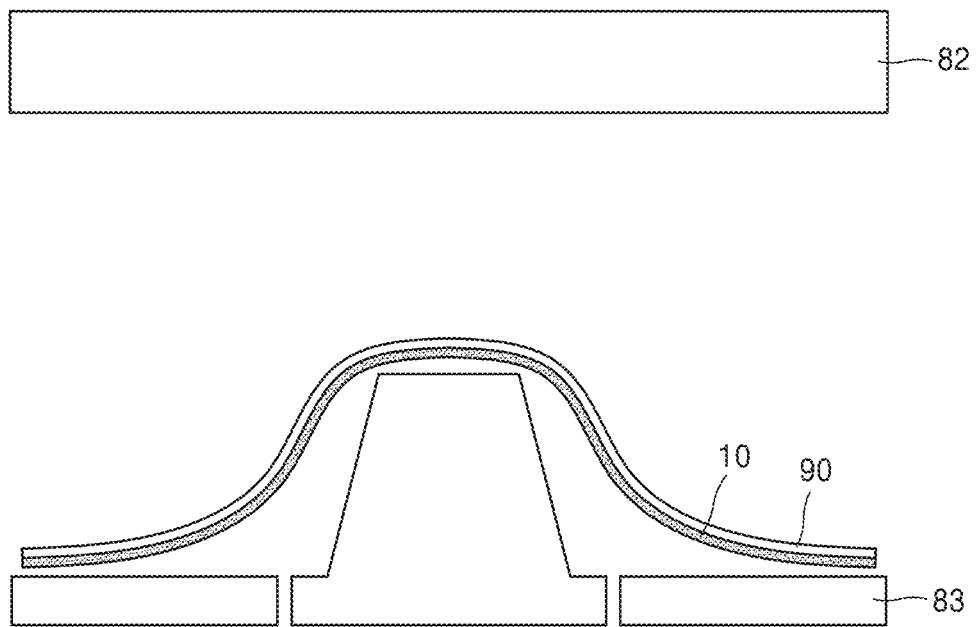

Referring to FIG. 10B, it is shown that the molding film 90 is softened by preheating. Referring to FIGS. 10B and 10C, when the first clamp 81*a* and the second clamp 81*b* descend, the molding film 90 may contact the surface of the mold 83 while the molding film 90 is stretched. In another embodiment, the first clamp 81*a* and the second clamp 81*b* are fixed, and the molding film 90 may contact the surface of the mold 83 when the mold 83 ascends.

Figure 10D:
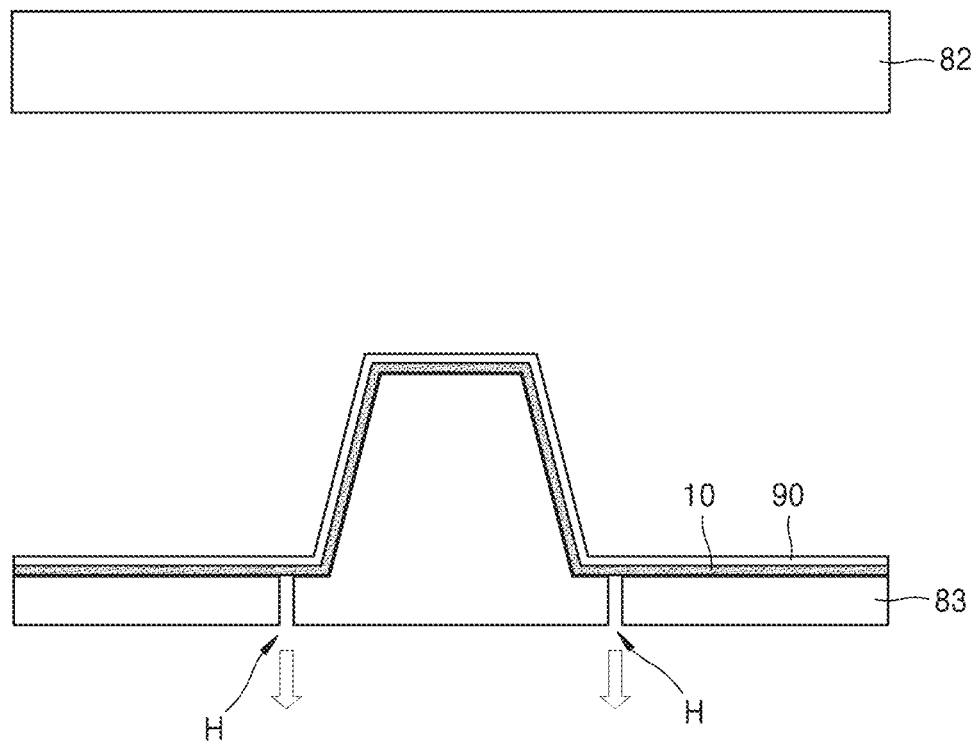

Next, referring to FIG. 10D, air between the molding film 90 and the mold 83 may escape through a plurality of holes H defined in the mold 83, and thus, a vacuum state may be achieved. As a result, the molding film 90 may be in close contact with the surface of the mold 83, and thus, forming may be performed.

Figure 10E:
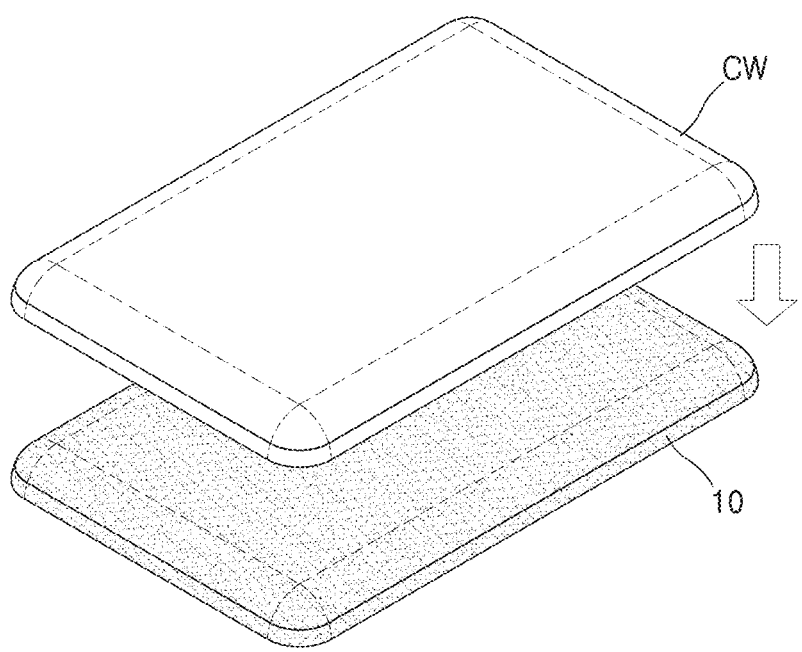

Next, referring to FIG. 10E, an operation of attaching the display panel 10 to the cover window CW may be performed, and the display apparatus 10 may be provided through the method of manufacturing the display apparatus shown in FIGS. 10A to 10D.

Like the method of manufacturing the display apparatus in an embodiment, in the case where the shape of the display panel 10 is transformed by heat, the entire surface of the display panel 10 may be simultaneously transformed. Particularly, in the case of transforming the shape of the corner display area CDA arranged in the corner of the display panel 10, various forces such as shrinking and stretching are simultaneously applied to the corner display area CDA. The shape of the corner display area CDA may be transformed at once by heat and the mold 83.

Figure 11:
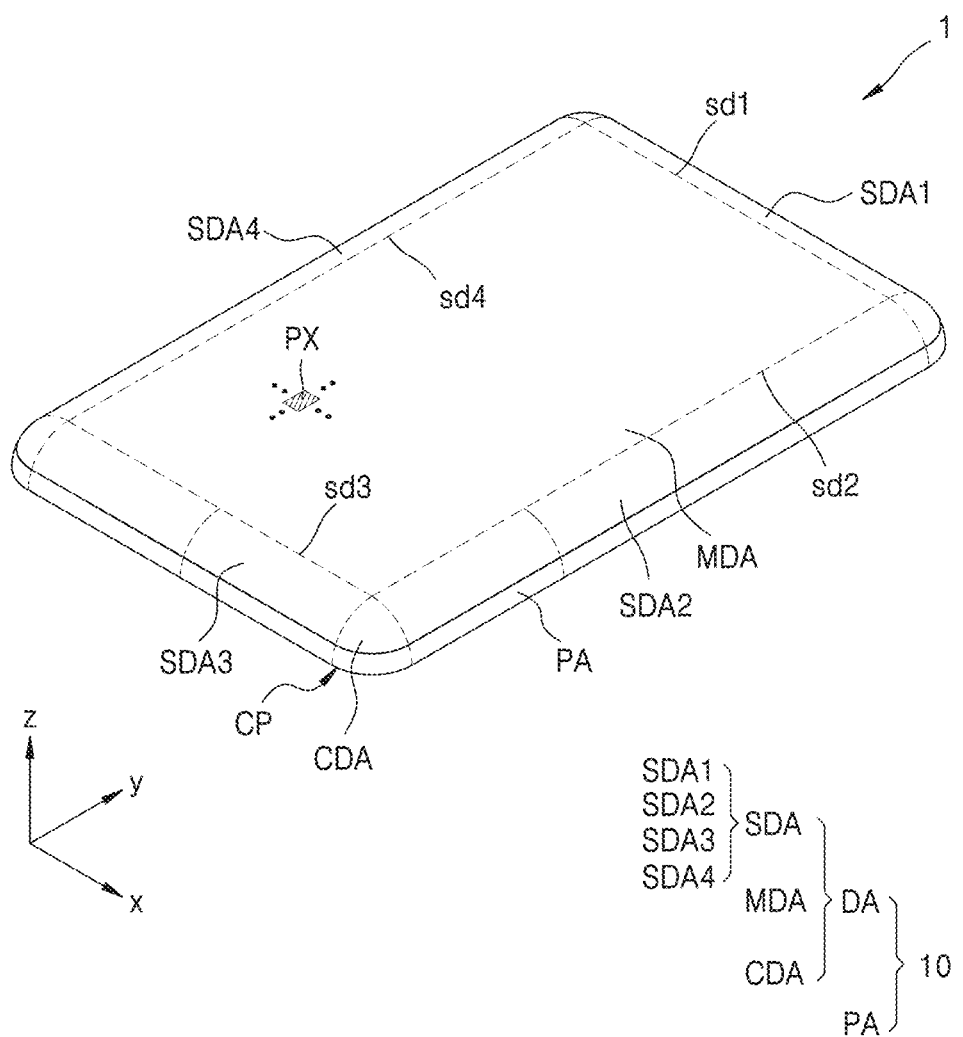
FIG. 11 is a perspective view of an embodiment of a display apparatus manufactured by a method of manufacturing a display apparatus.
Figure 12A:
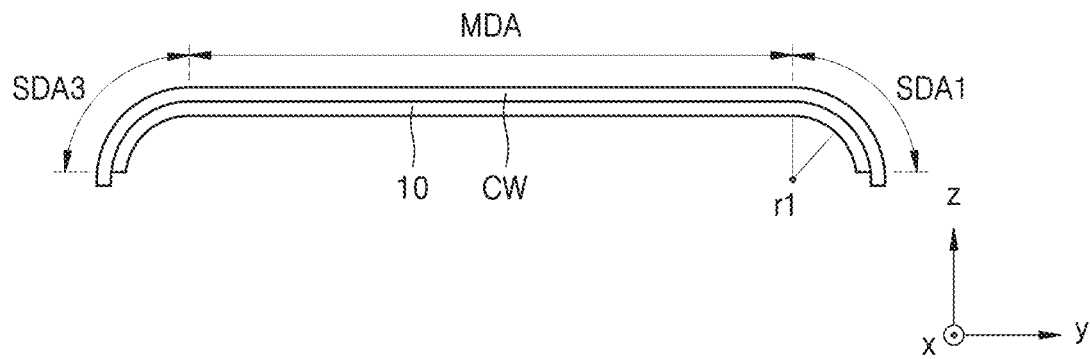
FIGS. 12A, 12B, and 12C are cross-sectional views of an embodiment of a display apparatus manufactured by a method of manufacturing a display apparatus.
Figure 12B:
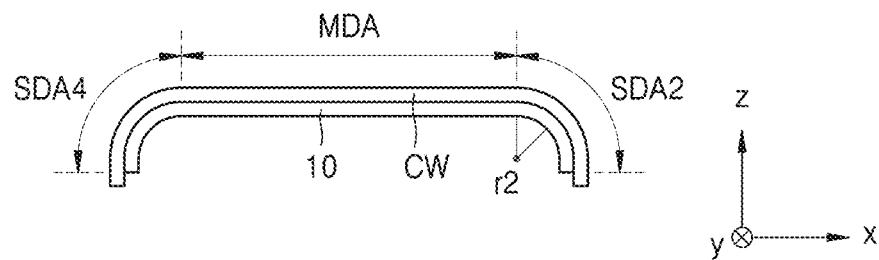
Figure 12C:
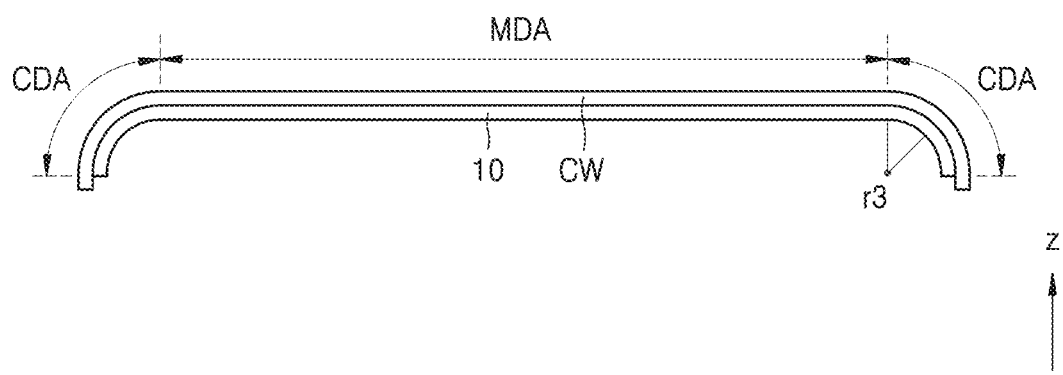

FIG. 11 is a perspective view of an embodiment of a display apparatus manufactured by a method of manufacturing a display apparatus, and FIGS. 12A, 12B, and 12C are cross-sectional views of an embodiment of a display apparatus manufactured by a method of manufacturing a display apparatus. In an embodiment, FIG. 12A is a cross-sectional view of the display apparatus in a y-direction of FIG. 11. FIG. 12B is a cross-sectional view of the display apparatus in an x-direction of FIG. 11. FIG. 12C is a cross-sectional view of corner display areas on two opposite sides of the main display area in the display apparatus.

FIG. 11 shows the display apparatus 1 manufactured by the method of manufacturing the display apparatus described in FIGS. 6A to 6L, FIGS. 7AA and 7B, FIGS. 8A to 8F, FIGS. 9A to 9E, and FIGS. 10A to 10E.

The display apparatus 1 may include an apparatus for displaying moving images or still images and may be used as a display screen of various products including televisions, notebook computers, monitors, advertisement boards, Internet of things ("IOT") as well as portable electronic apparatuses including mobile phones, smart phones, tablet personal computers ("PCs"), mobile communication terminals, electronic organizers, electronic books, portable multimedia players ("PMPs"), navigations, and ultra-mobile personal computers ("UMPCs").

The display apparatus 1 may be used in wearable devices including smartwatches, watchphones, glasses-type displays, and head-mounted displays ("HMDs"). In addition, the display apparatus 1 may be used as instrument panels for automobiles, center fascias for automobiles, or center information displays ("CIDs") arranged on a dashboard, room mirror displays that replace side mirrors of automobiles, and displays arranged on the backside of front seats as an entertainment for back seats of automobiles.

The display apparatus 1 may include a long side in the first direction and a short side in the second direction. Here, the first direction and the second direction may be directions crossing each other. In an embodiment, the first direction and the second direction may form an acute angle. In another embodiment, the first direction and the second direction may form a dull angle or a right angle. Hereinafter, the case where the first direction (e.g. the y-direction) and the second direction (e.g. the x-direction) form a right angle is mainly described in detail.

In another embodiment, in the display apparatus 1, a side in the first direction (e.g. the y-direction) and a side in the second direction (e.g. the x-direction) may have the same length. In another embodiment, the display apparatus 1 may include a short side in first direction (e.g. the y-direction) and a long side in the second direction (e.g. the x-direction).

A corner where the long side in the first direction (e.g. the y-direction) meets the short side in the second direction (e.g. the x-direction) may be round to have a preset curvature.

Referring to FIGS. 12A to 12C, the display apparatus 1 may include the display panel 10 and the cover window CW. The cover window CW may protect the display panel 10.

The cover window CW may be a flexible window. The cover window CW may protect the display panel 10 while easily bending according to external force without generating cracks. The cover window CW may include glass, sapphire, or plastic. In an embodiment, the cover window CW may include ultras thin glass ("UTG") or colorless polyimide ("CPI"). In an embodiment, the cover window CW may have a structure in which a flexible polymer layer is arranged on one side of a glass substrate, or include only a polymer layer.

The display panel 10 may be arranged under the cover window CW. Though not shown in FIGS. 12A to 12C, the display panel 10 may be attached to the cover window CW by a transparent adhesive member such as an OCA film.

The display panel 10 may include a display area DA and a peripheral area PA. The display area DA may display an image, and the peripheral area PA may surround the display area DA. The display area DA may include a plurality of pixels PX and display an image through the plurality of pixels PX. The plurality of pixels PX may each include sub-pixels. In an embodiment, the plurality of pixels PX may each include a red sub-pixel, a green sub-pixel, and a blue sub-pixel. In an alternative embodiment, the plurality of pixels PX may each include a red sub-pixel, a green sub-pixel, a blue sub-pixel, and a white sub-pixel.

The display area DA may include the main display area MDA, the subsidiary display area SDA, and the corner display area CDA. The main display area MDA, the subsidiary display area SDA, and the corner display area CDA may each include a plurality of pixels PX. The plurality of pixels PX may display an image.

In an embodiment, the plurality of pixels PX arranged in each of the main display area MDA, the subsidiary display area SDA, and the corner display area CDA may provide an independent image. In another embodiment, the plurality of pixels PX arranged in each of the main display area MDA, the subsidiary display area SDA, and the corner display area CDA may provide a portion of one image.

The main display area MDA is a flat display area and may include a pixel PX including a display element. The main display area MDA may provide most of an image.

A pixel PX including a display element may be arranged also in the subsidiary display area SDA. The subsidiary display area SDA may display an image through pixels PX. The subsidiary display area SDA may include a first subsidiary display area SDA1, a second subsidiary display area SDA2, a third subsidiary display area SDA3, and a fourth subsidiary display area SDA4. At least one of the first subsidiary display area SDA1, the second subsidiary display area SDA2, the third subsidiary display area SDA3, and the fourth subsidiary display area SDA4 may be omitted.

The first subsidiary display area SDA1 and the third subsidiary display area SDA3 may be connected to the main display area MDA in the first direction (e.g. the y-direction). In an embodiment, the first subsidiary display area SDA1 may be connected from the main display area MDA in the (+) y-direction, and the third subsidiary display area SDA3 may be connected from the main display area MDA in the (−) y-direction. The first subsidiary display area SDA1 may be connected to the first side sd1 of the main display area MDA, and the third subsidiary display area SDA3 may be connected to the third side sd3 of the main display area MDA.

The first subsidiary display area SDA1 and the third subsidiary display area SDA3 may each be bent with an arbitrary curvature radius. In an embodiment, the curvature radius of the first subsidiary display area SDA1 may be different from the curvature radius of the third subsidiary display area SDA3. In another embodiment, the curvature radius of the first subsidiary display area SDA1 may be the same as the curvature radius of the third subsidiary display area SDA3. Hereinafter, the case where the first subsidiary display area SDA1 and the third subsidiary display area SDA3 have the same curvature radius of a first curvature radius r1 is mainly described in detail. In addition, the first subsidiary display area SDA1 is similar to the third subsidiary display area SDA3, and thus, description is mainly made to the first subsidiary display area SDA1.

The second subsidiary display area SDA2 and the fourth subsidiary display area SDA4 may be connected to the main display area MDA in the second direction (e.g. the x-direction). In an embodiment, the second subsidiary display area SDA2 may be connected from the main display area MDA in the (+) x-direction, and the fourth subsidiary display area SDA4 may be connected from the main display area MDA in the (−) x-direction.

The second subsidiary display area SDA2 and the fourth subsidiary display area SDA4 may each be bent with an arbitrary curvature radius. In an embodiment, the curvature radius of the second subsidiary display area SDA2 may be different from the curvature radius of the fourth subsidiary display area SDA4. In another embodiment, the curvature radius of the second subsidiary display area SDA2 may be the same as the curvature radius of the fourth subsidiary display area SDA4. Hereinafter, the case where the second subsidiary display area SDA2 and the fourth subsidiary display area SDA4 have the same curvature radius of a second curvature radius r2 is mainly described in detail. In addition, the second subsidiary display area SDA2 is similar to the fourth subsidiary display area SDA4, and thus, description is mainly made to the second subsidiary display area SDA2.

In an embodiment, the first curvature radius r1 of the first subsidiary display area SDA1 may be different from the second curvature radius r2 of the second subsidiary display area SDA2. In an embodiment, the first curvature radius r1 may be less than the second curvature radius r2. In another embodiment, the first curvature radius r1 may be greater than the second curvature radius r2.

In another embodiment, the first curvature radius r1 of the first subsidiary display area SDA1 may be the same as the second curvature radius r2 of the second subsidiary display area SDA2. Hereinafter, the case where the first curvature radius r1 is greater than the second curvature radius r2 is mainly described in detail.

The corner display area CDA may extend and be bent from the corner of the main display area MDA. The corner display area CDA may correspond to a corner portion CP. Here, the corner portion CP is a corner of the display area DA and may be a portion where the long side of the display area DA in the first direction (e.g. the y-direction) meets the short side of the display area DA in the second direction (e.g. the x-direction).

The corner display area CDA may be arranged between neighboring subsidiary display areas SDA. In an embodiment, the corner display area CDA may be arranged between the first subsidiary display area SDA1 and the second subsidiary display area SDA2. The corner display area CDA may be arranged between the second subsidiary display area SDA2 and the third subsidiary display area SDA3, between the third subsidiary display area SDA3 and the fourth subsidiary display area SDA4, or between the fourth subsidiary display area SDA4 and the first subsidiary display area SDA1. Accordingly, the subsidiary display area SDA and the corner display area CDA may surround the main display area MDA and be bent with an arbitrary curvature radius.

A third curvature radius r3 of the corner display area CDA may vary. In an embodiment, in the case where the first curvature radius r1 of the first subsidiary display area SDA1 may be different from the second curvature radius r2 of the second subsidiary display area SDA2, the third curvature radius r3 of the corner display area CDA may be gradually changed within a range between the first curvature radius r1 and the second curvature radius r2.

In an embodiment, in the case where the first curvature radius r1 of the first subsidiary display area SDA1 is greater than the second curvature radius r2 of the second subsidiary display area SDA2, the third curvature radius r3 of the corner display area CDA may be gradually reduced in a direction from the first subsidiary display area SDA1 to the second subsidiary display area SDA2. In an embodiment, the third curvature radius r3 of the corner display area CDA may be less than the first curvature radius r1 and greater than the second curvature radius r2.

In the illustrated embodiment, the display apparatus 1 may display an image not only in the main display area MDA but in the subsidiary display area SDA and the corner display area CDA. Accordingly, a ratio of the display area DA in the display apparatus 1 may increase. In addition, the display apparatus 1 may include the corner display area CDA bent in the corner thereof and which displays an image, and thus, an aesthetic sense of the display apparatus 1 may be improved.

Figure 13A:
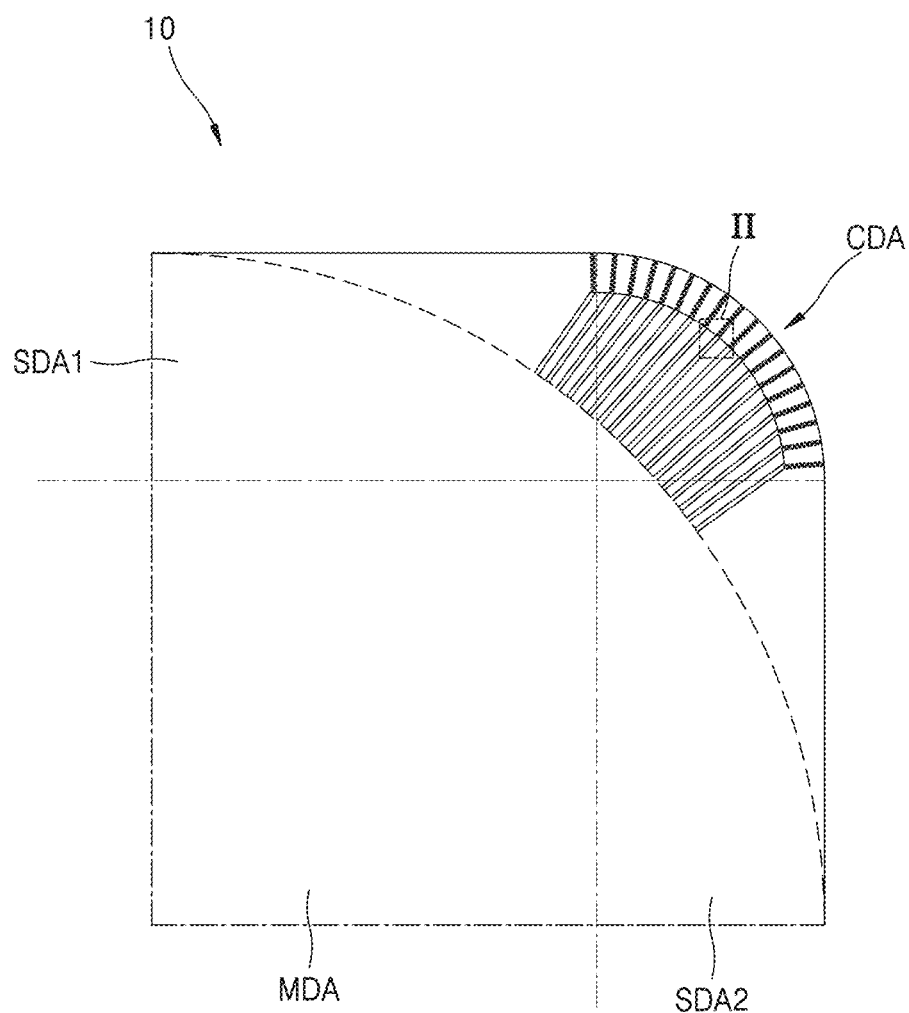
FIG. 13A is an enlarged plan view of an embodiment of a portion of a display panel.
Figure 13B:
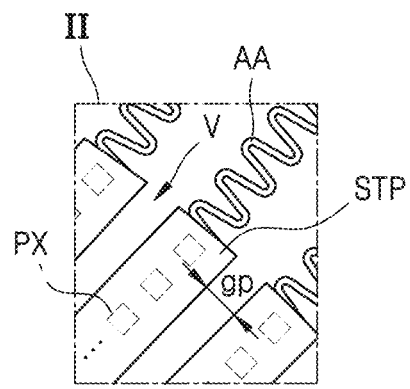
FIG. 13B is an enlarged plan view of a portion of FIG. 13A.

FIG. 13A is an enlarged plan view of an embodiment of a portion of the display panel 10 and FIG. 13B is an enlarged plan view of a portion of FIG. 13A. In detail, FIG. 13 enlarges the corner display area of the display panel 10 and shows a state of the display panel 10 before the display panel 10 is bent.

Referring to FIG. 13, the display panel 10 may include a plurality of strip portions STP corresponding to the corner display area CDA, and a plurality of auxiliary portions AA, and a plurality of through portions V may be defined in the display panel 10. The plurality of auxiliary portions AA may be connected to the end of each of the plurality of strip portions STP. The plurality of through portions V may be defined between the plurality of strip portions STP and may pass through the display panel 10.

The ends of the plurality of strip portions STP may be apart from each other with a preset gap gp. Empty spaces are defined between the plurality of strip portions STP by the gaps gp, and the empty spaces may respectively correspond to the plurality of through portions V. The gaps gp between the plurality of strip portions STP may vary. In an embodiment, as shown in FIG. 13B, the gaps gp between the plurality of strip portions STP may increase toward the corner display area CDA from the main display area MDA. In another embodiment, the gaps gp between the plurality of strip portions STP may not vary and be constant. That is, the plurality of strip portions STP may be radially arranged or be parallel to each other.

Other ends of the plurality of strip portions STP may be connected to each other without being apart from each other. As shown in FIGS. 13A and 13B, the plurality of strip portions STP may be connected to each other in a portion close to the main display area MDA. In addition, the plurality of strip portions STP may each extend from the main display area MDA to the corner display area CDA, and define the plurality of through portions V between the plurality of strip portions STP. Extended lengths of the plurality of strip portions STP may be different from each other. Extended lengths of the plurality of strip portions STP may be different from each other depending on a distance by which the plurality of strip portions STP is apart from the central portion of the corner display area CDA. In an embodiment, strip portions STP arranged in the central portion from among the plurality of strip portions STP may have a longer length extending to the corner display area CDA than the other strip portions STP. As a distance by which the plurality of strip portions STP is apart from the central portion of the corner display area CDA increases, extended lengths of the plurality of strip portions STP may be reduced.

Each through portion V may pass through the front surface and the bottom surface of the display panel 10. Each through portion V may reduce the weight of the display panel 10 and improve the flexibility of the display panel 10. In addition, in the case where external force (force such warping, bending, or pulling) is applied to the display panel 10, the shape of the through portion V is changed, and thus, stress occurrence while the display panel 10 is transformed is easily reduced, abnormal transformation of the display panel 10 may be prevented, and accordingly, durability of the display panel 10 may be improved. Though this, user convenience may be improved when a user uses an electronic apparatus including the display panel 10, and the display panel 10 is easily applicable to a wearable apparatus.

In the case where external force is applied to the display panel 10, the area or the shape of the through portion V may be changed, and the position of the strip portion STP may be changed. In an embodiment, force of bending the edges of the display panel 10 and the corner portions therebetween is applied, the gap gp between the plurality of strip portions STP is reduced, and thus, the area of the through portion V may be also reduced, and the strip portions STP neighboring each other may contact each other.

As described above, in the case where external force is applied to the display panel 10, the gap gp between the plurality of strip portions STP and the area of the through portion V, etc., may be changed, and the shape of the plurality of strip portions STP may not be changed. That is, a pixel circuit, a light-emitting element, etc., may be arranged on the plurality of strip portions STP. Even though external force is applied to the display panel 10, the shape of the plurality of strip portions STP is changed, and thus, a pixel circuit, a light-emitting element, etc., arranged on the plurality of strip portions STP may be protected. The plurality of auxiliary portions AA may be connected to the ends of the plurality of strip portions STP and may extend in a direction away from the main display area MDA. When the gaps gp between the plurality of strip portions STP are changed by external forces applied to the display panel 10, the plurality of auxiliary portions AA may prevent the plurality of strip portions STP neighboring each other from sticking together. The plurality of auxiliary portions AA is respectively connected to the plurality of strip portions STP, and may respectively hold to correspond to the plurality of strip portions STP. Through the plurality of auxiliary portions AA, the plurality of neighboring strip portions STP may not stick together, and only the gap gp between the plurality of neighboring strip portions STP may be reduced.

As described above, the shape of the plurality of neighboring strip portions STP may not be changed, and thus, pixels PX may be arranged also in the corner display area CDA of the display panel 10 having a curvature. Through this configuration, the display area DA (refer to FIG. 11) may extend from the main display area MDA and the subsidiary display area SDA to the corner display area CDA. Pixels PX arranged in the strip portion STP may be apart from each other in one direction. Pixels PX arranged in the strip portion STP may be arranged in various types such as a stripe type, an s-stripe type, or a pentile type.

Figure 14A:
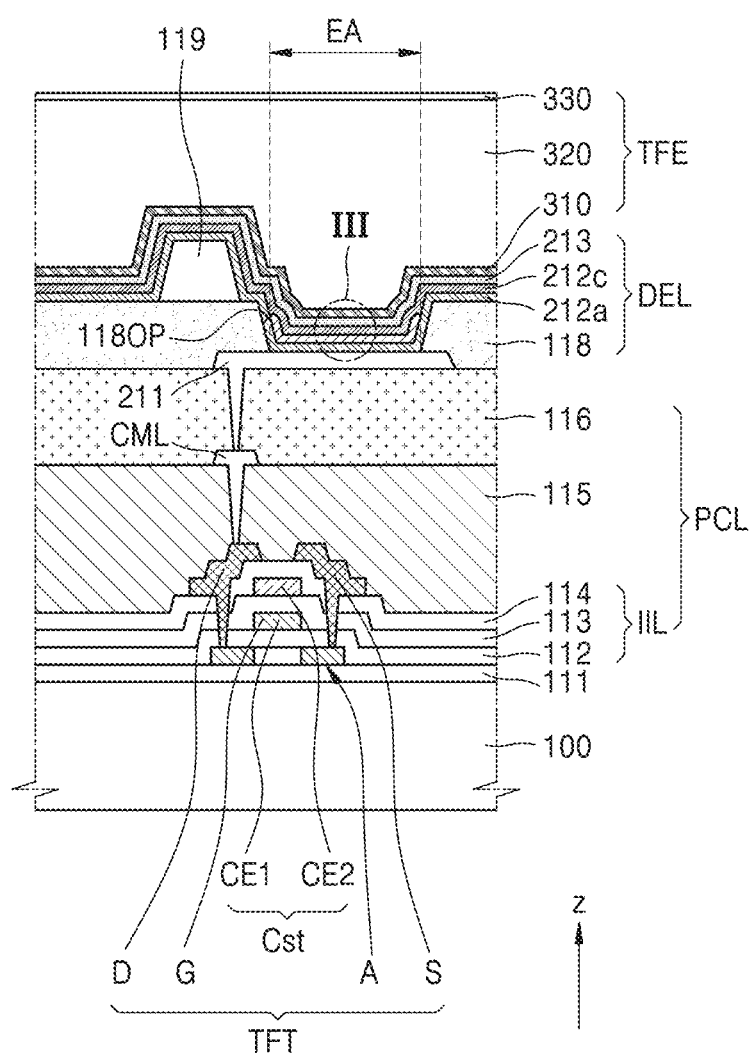
FIG. 14A is a cross-sectional view of an embodiment of a display apparatus manufactured by a method of manufacturing a display apparatus.
Figure 14B:
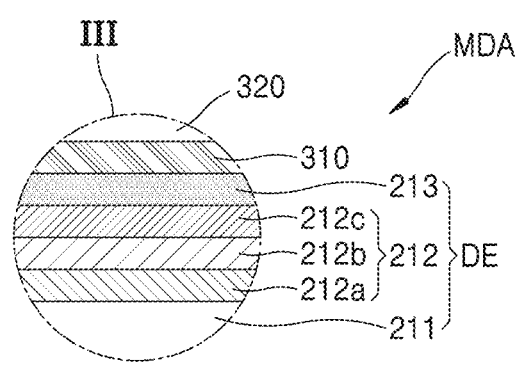
FIG. 14B is an enlarged view of a portion of FIG. 14A.

FIG. 14A is a cross-sectional view of an embodiment of a display apparatus manufactured by a method of manufacturing a display apparatus, and FIG. 14B is an enlarged view of a portion of FIG. 14A. In an embodiment, FIG. 14A shows a cross-section of a pixel in a display apparatus, and some elements may be omitted. Hereinafter, a multi-layer stacked in the display apparatus is described in detail.

Referring to FIG. 14A, the display apparatus may include a substrate 100, a buffer layer 111, a pixel circuit layer PCL, a display element layer DEL, and a thin-film encapsulation layer TFE.

In an embodiment, the substrate 100 may include glass or a polymer resin such as polyethersulfone, polyarylate, polyetherimide, polyethylene naphthalate, polyethylene terephthalate, polyphenylene sulfide, polyarylate, polyimide, polycarbonate, cellulose tri acetate, or cellulose acetate propionate. The substrate 100 having a polymer resin may be flexible, rollable, and bendable. The substrate 100 may have a multi-layered structure including a base layer and a barrier layer (not shown), the base layer including a polymer resin.

The buffer layer 111 may include an inorganic insulating material such as silicon nitride, silicon oxynitride, and silicon oxide and include a single layer or a multi-layer including the inorganic insulating materials.

The pixel circuit layer PCL may be arranged on the buffer layer 111. The pixel circuit layer PCL may include a thin-film transistor TFT, an inorganic insulating layer IIL, a first planarization layer 115, and a second planarization layer 116 arranged under/on elements of the thin-film transistor TFT. The thin-film transistor TFT may be included in a pixel circuit. The inorganic insulating layer IIL may include a first gate insulating layer 112, a second gate insulating layer 113, and an inter-insulating layer 114.

The thin-film transistor TFT may include a semiconductor layer A, which includes polycrystalline silicon. In an alternative embodiment, the semiconductor layer A may include amorphous silicon, an oxide semiconductor, or an organic semiconductor. The semiconductor layer A may include a channel region, a drain region, and a source region, the drain region and the source region respectively being on two opposite sides of the channel region. The gate electrode G may overlap the channel region.

The gate electrode G may include a low-resistance metal material. The gate electrode G may include a conductive material including molybdenum (Mo), aluminum (Al), copper (Cu), or titanium (Ti) and include a single layer or a multi-layer including the above materials.

In an embodiment, the first gate insulating layer 112 between the semiconductor layer A and the gate electrode G may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the second gate insulating layer 113 may cover the gate electrode G. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A top electrode CE2 of a storage capacitor Cst may be arranged on the second gate insulating layer 113. The top electrode CE2 may overlap the gate electrode G therebelow. In this case, the gate electrode G and the top electrode CE2 overlapping each other with the second gate insulating layer 113 therebetween may constitute a storage capacitor Cst. That is, the gate electrode G may serve as a bottom electrode CE1 of the storage capacitor Cst. Like this, the storage capacitor Cst may overlap the thin-film transistor TFT. In an embodiment, the storage capacitor Cst may not overlap the thin-film transistor TFT.

The top electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The inter-insulating layer 114 may cover the top electrode CE2. In an embodiment, the inter-insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The inter-insulating layer 114 may include a single layer or a multi-layer including the above inorganic insulating material.

The drain electrode D and the source electrode S may be arranged on the inter-insulating layer 114. The drain electrode D and the source electrode S may include a material having an excellent conductivity. In an embodiment, the drain electrode D and the source electrode S may include a conductive material including molybdenum (Mo), aluminum (Al), copper (Cu), or titanium (Ti) and include a single layer or a multi-layer including the above materials. In an embodiment, the drain electrode D and the source electrode S may include a multi-layered structure of Ti/Al/Ti.

The first planarization layer 115 may cover the drain electrode D and the source electrode S. The first planarization layer 115 may include an organic insulating layer. The first planarization layer 115 may include an organic insulating material such as a general-purpose polymer including PMMA or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

A connection electrode CML may be arranged on the first planarization layer 115. In this case, the connection electrode CML may be connected to the drain electrode D or the source electrode S through a contact hole of the first planarization layer 115. The connection electrode CML may include a material having an excellent conductivity. In an embodiment, the connection electrode CML may include a conductive material including molybdenum (Mo), aluminum (Al), copper (Cu), or titanium (Ti) and include a single layer or a multi-layer including the above materials. In an embodiment, the connection electrode CML may have a multi-layered structure of Ti/Al/Ti.

The second planarization layer 116 may cover the connection electrode CML. The second planarization layer 116 may include an organic insulating layer. The second planarization layer 116 may include an organic insulating material such as a general-purpose polymer including PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

The display element layer DEL may be arranged on the pixel circuit layer PCL. The display element layer DEL may include a display element DE. The display element DE may be an organic light-emitting diode OLED. A pixel electrode 211 of the display element DE may be electrically connected to the connection electrode CML through a contact hole of the second planarization layer 116.

In an embodiment, the pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a combination thereof. In another embodiment, the pixel electrode 211 may further include a layer including ITO, IZO, ZnO, or $In_2O_3$ on/under the reflective layer.

A pixel-defining layer 118 may be arranged on the pixel electrode 211, and an opening 1180P that exposes the central portion of the pixel electrode 211 may be defined in the pixel-defining layer 118. The pixel-defining layer 118 may include an organic insulating material and/or an inorganic insulating material. The opening 1180P may define an emission area EA of light (also referred to as an emission area) emitted from the display element DE. In an embodiment, the width of the opening 1180P may correspond to the width of the emission area EA of the display element DE.

A spacer 119 may be arranged on the pixel-defining layer 118. The spacer 119 may be designed to prevent destruction of the substrate 100 in a method of manufacturing a display apparatus. While the display panel is manufactured, a mask sheet may be used. In this case, the spacer 119 may prevent a portion of the substrate 100 from being damaged or destroyed by the mask sheet when the mask sheet may enter the inside of the opening 1180P of the pixel-defining layer 118, or while the mask sheet is in close contact with the pixel-defining layer 118 and a deposition material is deposited on the substrate 100.

The spacer 119 may include an organic insulating material such as polyimide. In an alternative embodiment, the spacer 119 may include an inorganic insulating material such as silicon nitride or silicon oxide, or include an organic insulating material and an inorganic insulating material.

In an embodiment, the spacer 119 may include a material different from the pixel-defining layer 118. In another embodiment, the spacer 119 may include the same material as that of the pixel-defining layer 118. In this case, the pixel-defining layer 118 and the spacer 119 may be simultaneously provided during a mask process that uses a half-tone mask.

An intermediate layer 212 may be arranged on the pixel-defining layer 118. The intermediate layer 212 may include an emission layer 212b arranged in the opening 1180P of the pixel-defining layer 118. The emission layer 212b may include a polymer or low-molecular weight organic material that emits light having a preset color.

A first functional layer 212a and a second functional layer 212c may be respectively arranged under and on the emission layer 212b. The first functional layer 212a may include, for example, a hole transport layer ("HTL"), or include an HTL and a hole injection layer ("HIL"). The second functional layer 212c is arranged on the emission layer 212b and may be omitted. The second functional layer 212c may include an electron transport layer ("ETL") and/or an electron injection layer ("EIL"). Like an opposite electrode 213 described below, the first functional layer 212a and/or the second functional layer 212c may be common layers covering the entire substrate 100.

The opposite electrode 213 may include a conductive material having a low work function. In an embodiment, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In an alternative embodiment, the opposite electrode 213 may further include a layer including ITO, IZO, ZnO, or $In_2O_3$ on the (semi) transparent layer including the above material.

In an embodiment, a capping layer (not shown) may be further arranged on the opposite electrode 213. The capping layer may include LiF, an inorganic material, and/or an organic material.

The thin-film encapsulation layer TFE may be arranged on the opposite electrode 213. In an embodiment, the thin-film encapsulation layer TFE includes at least one inorganic encapsulation layer and at least one organic encapsulation layer. It is shown in FIG. 14B that the thin-film encapsulation layer TFE includes a first inorganic encapsulation layer 310, an organic encapsulation layer 320, and a second inorganic encapsulation layer 330 that are sequentially stacked.

In an embodiment, the first inorganic encapsulation layer 310 and the second inorganic encapsulation layer 330 at least one inorganic material from among aluminum oxide, titanium oxide tantalum oxide hafnium oxide zinc oxide, silicon oxide silicon nitride, and silicon oxynitride. The organic encapsulation layer 320 may include a polymer-based material. In an embodiment, the polymer-based material may include an acryl-based resin, an epoxy-based resin, polyimide, or polyethylene. In an embodiment, the organic encapsulation layer 320 may include acrylate.

Though not shown, a touch electrode layer may be arranged on the thin-film encapsulation layer TFE. An optical functional layer may be arranged on the touch electrode layer. The touch electrode layer may obtain coordinate information according to an external input, for example, a touch event. The optical functional layer may reduce the reflectivity of light (external light) incident toward the display apparatus from the outside and/or improve color purity of light emitted from the display apparatus. In an embodiment, the optical functional layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the optical functional layer may include a black matrix and color filters. The color filters may be arranged by taking into account colors of pieces of light emitted respectively from the pixels of the display apparatus. The color filters may each include pigment or dye having a red, green, or blue color. In an alternative embodiment, the color filters may each further include a quantum dot in addition to the pigment or dye. In an alternative embodiment, some of the color filters may not include the pigment or dye and may include scattering particles such as titanium oxide.

In another embodiment, the optical functional layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

An adhesive member may be arranged between the touch electrode layer and the optical functional layer. The adhesive member generally known in the art may be employed without limitation. The adhesive member may be a PSA.

An embodiment provides a guide film that stably transforms the shape of a display panel and a method of manufacturing a display apparatus including a corner display area arranged around the corner of a main display area of the display panel. However, the scope of the invention is not limited by this effect.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein.

What is claimed is:

1. A guide film for stably changing a shape of a display panel including a pixel, the guide film comprising:
    a main area including:
        a central area having a rectangular shape and including a first side extending in a first direction and a second side extending in a second direction crossing the first direction in a plan view;
        a first side area;
        a second side area; and
        a first corner area unitarily extending from the first side area and the second side area in the plan view in an unbent state of the guide film;
    a first subsidiary area connected to a first edge of the main area; and
    a second subsidiary area connected to a second edge of the main area, the second edge intersecting the first edge of the main area and the second subsidiary area being apart from the first subsidiary area,
wherein:
    the first side area is disposed between the central area and the first subsidiary area,
    the second side area is disposed between the central area and the second subsidiary area,
    a Young's modulus of the first corner area is about 1 megapascal to about 50 megapascals,
    a main plane extension direction of the first corner area is parallel to a main plane extension direction of the first side area and the second side area in the unbent state of the guide film,
    a plurality of cut portions which extend in a third direction inclined between the first direction and the second direction is defined in the first corner area,
    the plurality of cut portions has a closed-curve shape, and
    a Young's modulus of the main area is less than a Young's modulus of the first subsidiary area and the second subsidiary area.

2. The guide film of claim 1, further comprising:
    a third subsidiary area connected to a third edge and apart from the second subsidiary area, the third edge being parallel to the first edge of the main area,
wherein the main area further includes:
    a third side area between the central area and the third subsidiary area; and
    a second corner area connecting the second side area to the third side area.

3. The guide film of claim 2, further comprising:
    a fourth subsidiary area connected to a fourth edge and apart from the third subsidiary area, the fourth edge being parallel to the second edge of the main area,
wherein the main area further includes:
    a fourth side area between the central area and the fourth subsidiary area; and
    a third corner area connecting the third side area to the fourth side area.

4. The guide film of claim 3, wherein the main area, the first subsidiary area, the second subsidiary area, the third subsidiary area, and the fourth subsidiary area are provided as one area.

5. The guide film of claim 1, wherein the first corner area includes silicon rubber.

6. The guide film of claim 1, wherein the main area has a multi-layered structure, and the first subsidiary area and the second subsidiary area each have a same layered structure as a layered structure of the main area.

7. The guide film of claim 6, wherein the main area includes a first layer, a second layer, and a third layer arranged between the first layer and the second layer.

8. The guide film of claim 7, wherein a Young's modulus of the first layer and the second layer is less than a modulus of the third layer.

* * * * *